US012648253B2

(12) United States Patent
Tsuboi et al.

(10) Patent No.: US 12,648,253 B2
(45) Date of Patent: Jun. 2, 2026

(54) PHOTOELECTRIC CONVERSION DEVICE

(71) Applicant: CANON KABUSHIKI KAISHA, Tokyo (JP)

(72) Inventors: Hiromasa Tsuboi, Tokyo (JP); Jumpei Ashida, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 602 days.

(21) Appl. No.: 18/173,261

(22) Filed: Feb. 23, 2023

(65) Prior Publication Data

US 2023/0282672 A1 Sep. 7, 2023

(30) Foreign Application Priority Data

Mar. 1, 2022 (JP) ................................. 2022-030665

(51) Int. Cl.
| | |
|---|---|
| *H10F 39/00* | (2025.01) |
| *H04N 25/46* | (2023.01) |
| *H04N 25/767* | (2023.01) |
| *H04N 25/778* | (2023.01) |

(52) U.S. Cl.
CPC .......... *H10F 39/813* (2025.01); *H04N 25/46* (2023.01); *H04N 25/767* (2023.01); *H04N 25/778* (2023.01); *H10F 39/8037* (2025.01); *H10F 39/8063* (2025.01); *H10F 39/807* (2025.01); *H10F 39/811* (2025.01)

(58) Field of Classification Search
CPC .......................... H04N 25/585; H10F 39/8023
See application file for complete search history.

(56) References Cited

U.S. PATENT DOCUMENTS

| | | | |
|---|---|---|---|
| 9,838,636 | B2 | 12/2017 | Tsuboi |
| 10,424,613 | B2 | 9/2019 | Tsuboi |
| 10,438,988 | B2 | 10/2019 | Tsuboi |
| 2016/0269655 | A1 | 9/2016 | Numata |
| 2017/0163917 | A1 | 6/2017 | Yamada et al. |
| 2017/0366769 | A1 | 12/2017 | Mlinar et al. |
| 2019/0096933 | A1* | 3/2019 | Kido .................... H10F 39/8027 |
| 2019/0228534 | A1 | 7/2019 | Kato et al. |
| 2022/0408036 | A1 | 12/2022 | Ashida |

FOREIGN PATENT DOCUMENTS

| | | |
|---|---|---|
| JP | 2015-153859 A | 8/2015 |
| JP | 2020-102498 A | 7/2020 |

OTHER PUBLICATIONS

U.S. Appl. No. 18/057,870, filed Nov. 22, 2022 by Jumpei Ashida.
Japanese Office Action issued Nov. 25, 2025 during prosecution of corresponding Japanese application No. 2022-030665 (English language machine-translation included).

* cited by examiner

*Primary Examiner* — Tucker J Wright
(74) *Attorney, Agent, or Firm* — VENABLE LLP

(57) ABSTRACT

In a photoelectric conversion device, a first photoelectric conversion unit and a second photoelectric conversion unit are arranged so as to be aligned in a first direction in a plan view with respect to a substrate, the sensitivity of a third photoelectric conversion unit is lower than the sensitivity of the first photoelectric conversion unit and lower than the sensitivity of the second photoelectric conversion unit, and the third photoelectric conversion unit is arranged along a part of the outer circumference of a region including the first photoelectric conversion unit and the second photoelectric conversion unit in the plan view.

24 Claims, 16 Drawing Sheets

Figure 15:
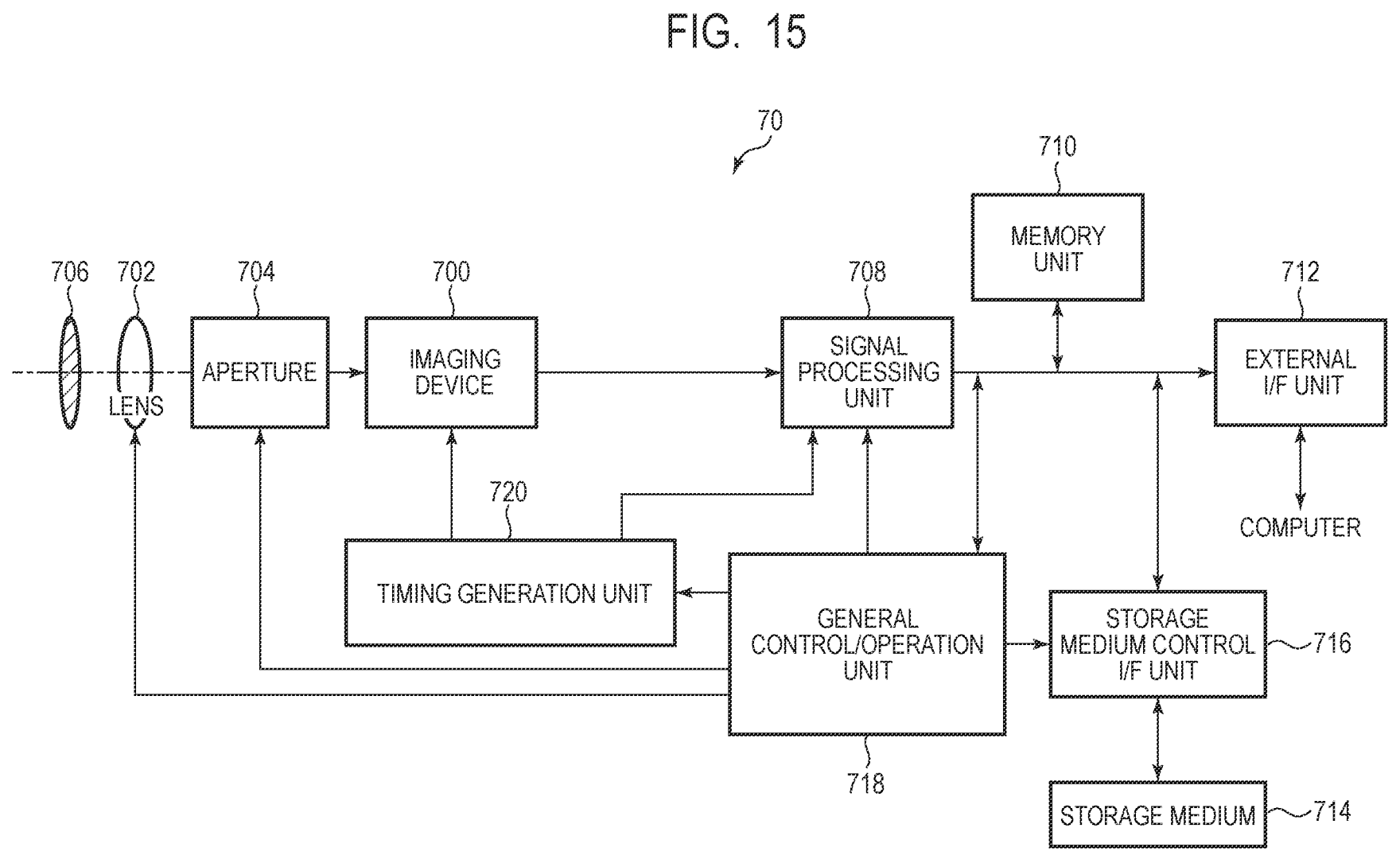

LENS

704

APERTURE

700

IMAGING DEVICE

720

TIMING GENERATION UNIT

708

SIGNAL PROCESSING UNIT

710

MEMORY UNIT

712

EXTERNAL I/F UNIT

COMPUTER

718

GENERAL CONTROL/OPERATION UNIT

716

STORAGE MEDIUM CONTROL I/F UNIT

714

STORAGE MEDIUM

80

| IMAGING DEVICE | 800 |

| IMAGE PROCESSING UNIT | 801 |

| PARALLAX CALCULATION UNIT | 802 |

| DISTANCE MEASUREMENT UNIT | 803 |

| COLLISION DETERMINATION UNIT | 804 |

810

VEHICLE INFORMATION ACQUISITION DEVICE

820    CONTROL ECU

830    ALERT DEVICE

PHOTOELECTRIC CONVERSION DEVICE

BACKGROUND I/F THE INVENTION

Field of the Invention

The present invention relates to a photoelectric conversion device.

Description of the Related Art

U.S. Patent Application Publication No. 2017/0366769 discloses an image sensor including pixels configured such that photoelectric conversion units having high sensitivity are arranged to surround photoelectric conversion units having low sensitivity. Signals output from photoelectric conversion units having high sensitivity and signals output from photoelectric conversion units having low sensitivity are used for generating high-dynamic range image.

In the photoelectric conversion device configured as described above, it is expected that a pixel configured to transfer charges from a photoelectric conversion unit to a floating diffusion is employed. In such a case, the floating diffusion may be arranged between a photoelectric conversion unit having high sensitivity and a photoelectric conversion unit having low sensitivity. In such a configuration, light guided to a part near the center of the pixel may enter the floating diffusion, and this may cause a signal loss.

SUMMARY OF THE INVENTION

The present invention intends to provide a photoelectric conversion device that achieves a reduced signal loss.

According to a disclosure of the present specification, there is provided a photoelectric conversion device including: a substrate; a first photoelectric conversion unit, a second photoelectric conversion unit, and a third photoelectric conversion unit each arranged in the substrate and configured to generate charges based on incident light; a microlens arranged over the substrate commonly to the first photoelectric conversion unit, the second photoelectric conversion unit, and the third photoelectric conversion unit; a floating diffusion arranged in the substrate; a first transfer transistor arranged in the substrate and configured to transfer charges generated by the first photoelectric conversion unit to the floating diffusion; a second transfer transistor arranged in the substrate and configured to transfer charges generated by the second photoelectric conversion unit to the floating diffusion; and a third transfer transistor arranged in the substrate and configured to transfer charges generated by the third photoelectric conversion unit to the floating diffusion. The first photoelectric conversion unit and the second photoelectric conversion unit are arranged so as to be aligned in a first direction in a plan view with respect to the substrate. Sensitivity of the third photoelectric conversion unit is lower than sensitivity of the first photoelectric conversion unit and lower than sensitivity of the second photoelectric conversion unit. The third photoelectric conversion unit is arranged along a part of an outer circumference of a region including the first photoelectric conversion unit and the second photoelectric conversion unit in the plan view.

According to a disclosure of the present specification, there is provided a photoelectric conversion device including: a substrate; a first photoelectric conversion unit, a second photoelectric conversion unit, and a third photoelectric conversion unit each arranged in the substrate and configured to generate charges based on incident light; and a microlens arranged over the substrate commonly to the first photoelectric conversion unit, the second photoelectric conversion unit, and the third photoelectric conversion unit. A saturated charge amount of the third photoelectric conversion unit is smaller than a saturated charge amount of the first photoelectric conversion unit and smaller than a saturated charge amount of the second photoelectric conversion unit. The first photoelectric conversion unit and the second photoelectric conversion unit are arranged so as to be aligned in a first direction in a plan view with respect to the substrate. In a second direction orthogonal to the first direction, the centroid position of the third photoelectric conversion unit differs from the centroid position of the first photoelectric conversion unit and the centroid position of the second photoelectric conversion unit.

According to a disclosure of the present specification, there is provided a photoelectric conversion device including: a substrate; a first photoelectric conversion unit, a second photoelectric conversion unit, and a third photoelectric conversion unit each arranged in the substrate and configured to generate charges based on incident light; and a microlens arranged over the substrate commonly to the first photoelectric conversion unit, the second photoelectric conversion unit, and the third photoelectric conversion unit. A saturated charge amount of the third photoelectric conversion unit is smaller than a saturated charge amount of the first photoelectric conversion unit and smaller than a saturated charge amount of the second photoelectric conversion unit. The first photoelectric conversion unit and the second photoelectric conversion unit are arranged so as to be aligned in a first direction in a plan view with respect to the substrate. In the first direction, a distance between the centroid position of the third photoelectric conversion unit and the centroid position of the second photoelectric conversion unit is larger than a distance between the centroid position of the third photoelectric conversion unit and the centroid position of the first photoelectric conversion unit.

Further features of the present invention will become apparent from the following description of exemplary embodiments with reference to the attached drawings.

BRIEF DESCRIPTION OF THE DRAWINGS

FIG. 1 is a block diagram illustrating a general configuration of a photoelectric conversion device according to a first embodiment.

FIG. 5 is a block diagram illustrating a general configuration of a photoelectric conversion device according to a second embodiment.

FIG. 15 is a block diagram of equipment according to an eighth embodiment.

DESCRIPTION OF THE EMBODIMENTS

Figure 2:
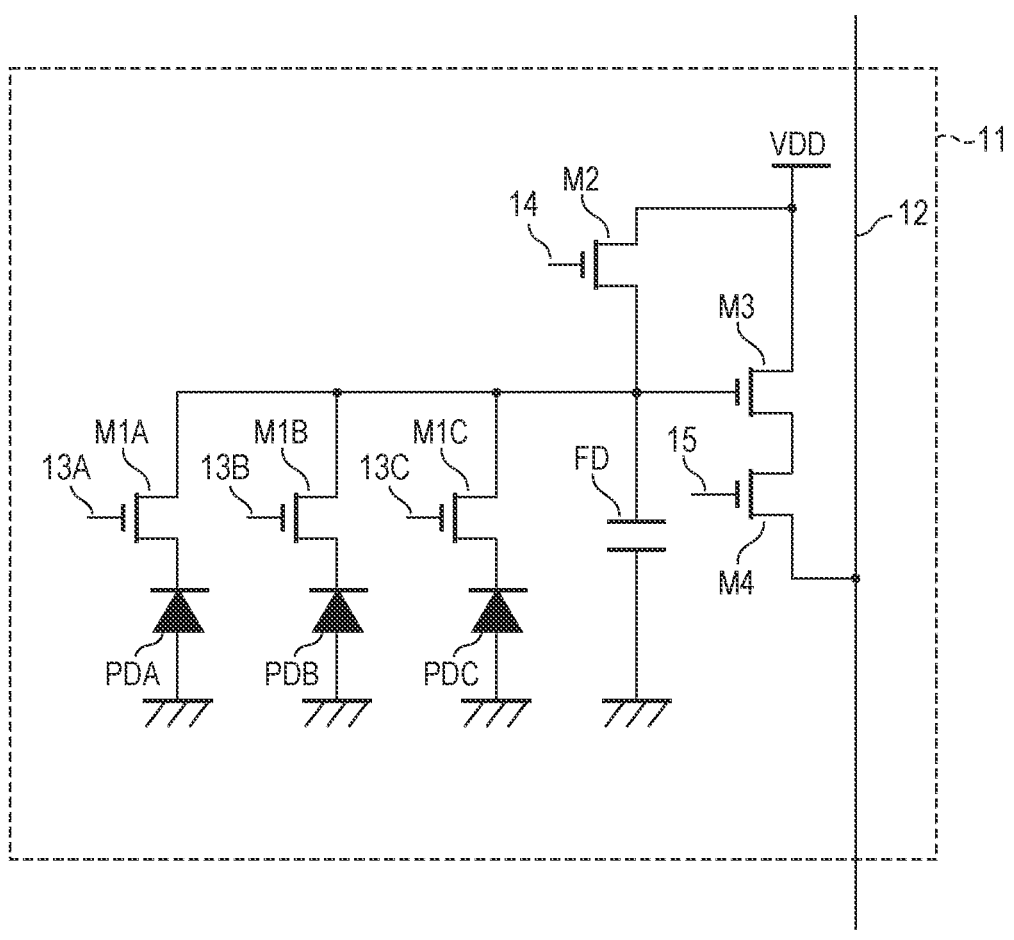
FIG. 2 is a circuit diagram of a pixel according to the first embodiment.

Preferred embodiments of the present invention will now be described in detail in accordance with the accompanying drawings. Note that the present invention is not limited to the following embodiments and can be modified as appropriate within the scope not departing from the spirit thereof. Further, throughout the drawings described below, elements having the same function are labeled with the same reference, and the description thereof may be omitted or simplified.

In the following description, a semiconductor region of a first conductivity type in which the majority carrier is the same carrier as a signal carrier is defined as an N-type semiconductor region, and a semiconductor region of a second conductivity type is defined as a P-type semiconductor region. That is, in the following description, the signal carrier is an electron. Further, all transistors included in a pixel are N-type MOS transistors. In all the transistors, however, the polarity and the conductivity type may be opposite. That is, the signal carrier may be a hole, the semiconductor region of the first conductivity type may be the P-type semiconductor region, and the semiconductor region of the second conductivity type may be the N-type semiconductor region. In such a case, transistors of a pixel may be P-type MOS transistors. In such a way, the conductivity type of a transistor or the like can be changed as appropriate in accordance with the polarity of charges handled as a signal.

In a first embodiment to a seventh embodiment described below, an imaging device will be described mainly as an example of photoelectric conversion devices. However, the photoelectric conversion device in each embodiment is not limited to an imaging device and is applicable to other photodetection devices whose operation is based on photoelectric conversion. An example of other photodetection devices may be a ranging device, a photometric device, or the like. The ranging device may be, for example, a focus detection device, a distance measuring device using Time-Of-Flight (TOF), or the like. The photometric device may be a device for measuring a light amount of light entering the device.

First Embodiment

Figure 1:
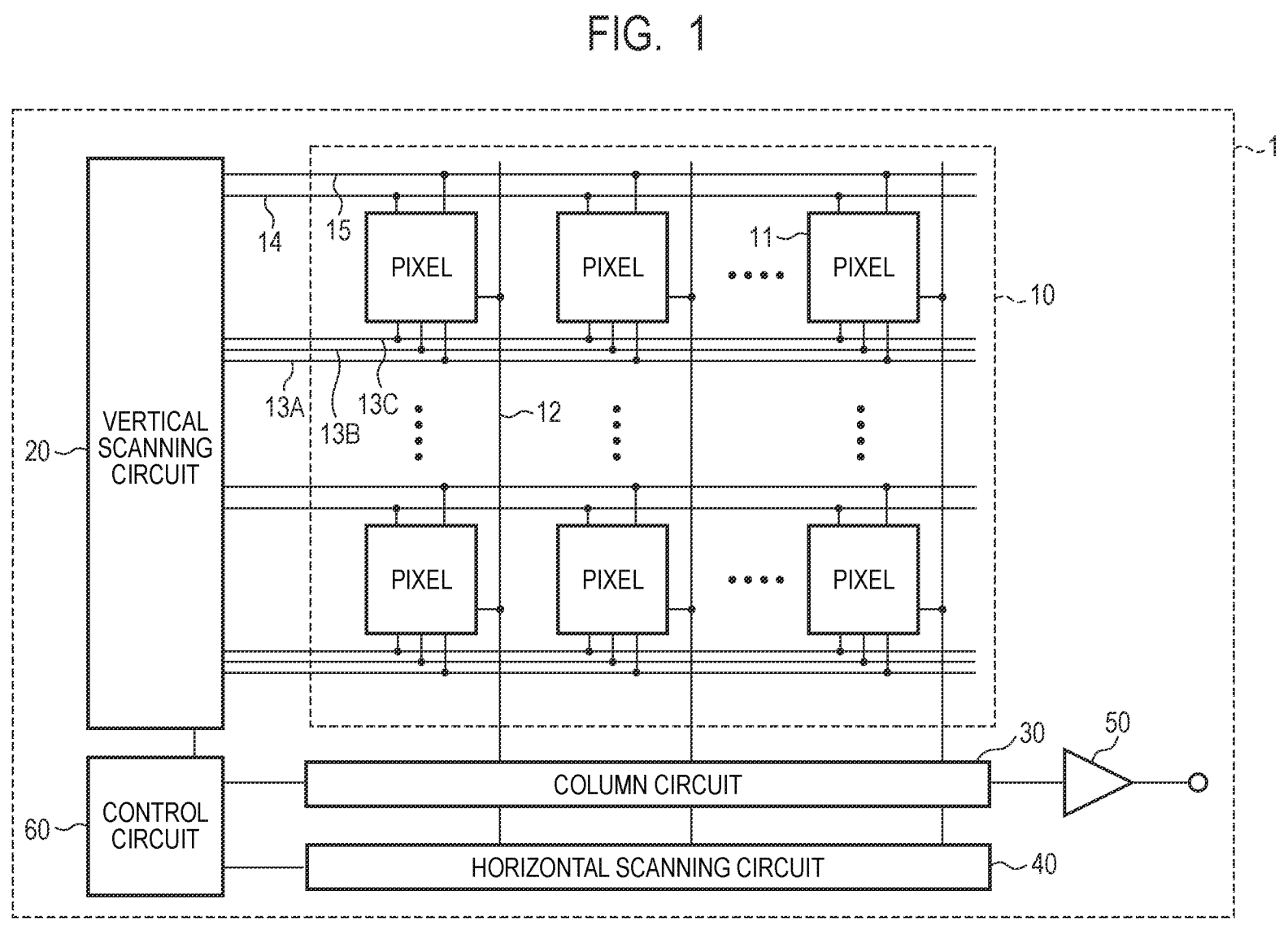

The first embodiment will be described with reference to FIG. 1 to FIG. 4. FIG. 1 is a block diagram illustrating the general configuration of a photoelectric conversion device 1 according to the present embodiment. The photoelectric conversion device 1 has a pixel array 10, a vertical scanning circuit 20, a column circuit 30, a horizontal scanning circuit 40, an output circuit 50, and a control circuit 60.

The control circuit 60 outputs control signals such as a vertical synchronization signal, a horizontal synchronization signal, a clock signal, and the like to the vertical scanning circuit 20, the column circuit 30, and the horizontal scanning circuit 40. Thereby, the control circuit 60 controls the operation of these circuits.

The pixel array 10 has a plurality of pixels 11 arranged to form a plurality of rows in the row direction (the horizontal direction in FIG. 1) and a plurality of columns in the column direction (the vertical direction in FIG. 1). Each of the plurality of pixels 11 has photoelectric conversion units described later. Accordingly, each of the plurality of pixels 11 outputs a signal based on incident light.

Scan lines 13A, 13B, 13C, 14, 15 are arranged extending in the row direction on each row of the pixel array 10. Each of the scan lines 13A, 13B, 13C, 14, 15 is connected to a plurality of pixels 11 aligned in the row direction to form a scan line common to these pixels 11. The scan lines 13A, 13B, 13C, 14, 15 are connected to the vertical scanning circuit 20.

A signal line 12 is arranged extending in the column direction on each column of the pixel array 10. The signal line 12 is connected to a plurality of pixels 11 aligned in the column direction to form a signal line common to these pixels 11. The signal line 12 is connected to the column circuit 30 and a current source (not illustrated) that supplies drive current to the signal lines.

The vertical scanning circuit 20, the column circuit 30, the horizontal scanning circuit 40, the output circuit 50, and the control circuit 60 represent a drive circuit unit that controls driving of the pixel array 10. In FIG. 1, the drive circuit unit is arranged in the periphery of the pixel array 10. However, the location where the drive circuit unit is arranged is not limited thereto. For example, when the photoelectric conversion device of the present embodiment is of a stacked type having a structure with a plurality of stacked substrates, the drive circuit unit may be arranged in a region overlapping the pixel array 10 in a plan view. Note that, in the present specification, the plan view refers to viewing a plane parallel to a light incident surface of a substrate including photoelectric conversion units from the normal direction of the plane parallel to the light incident surface.

The vertical scanning circuit 20 is a scanning circuit including logic circuits such as a shift register, a gate circuit, a buffer circuit, or the like. The vertical scanning circuit 20 supplies control signals to the pixels 11 via the scan lines 13A, 13B, 13C, 14, 15 based on the vertical synchronization signal, the horizontal synchronization signal, the clock signal, or the like. Accordingly, the vertical scanning circuit 20 performs a scan to output signals sequentially on a row basis from the pixels 11. Further, the vertical scanning circuit 20 controls an accumulation period of charges in the pixels 11.

The column circuit 30 includes an amplifier circuit, a signal holding circuit, or the like. The column circuit 30 performs a predetermined process on a column basis (for example, noise removal, signal amplification, or the like) on electrical signals input via signal lines 12 from the pixels 11 on each column. The column circuit 30 outputs processed signals to the output circuit 50 sequentially on a column basis under the control of the horizontal scanning circuit 40.

The horizontal scanning circuit 40 is a scanning circuit including logic circuits such as a shift register, a gate circuit, a buffer circuit, or the like. The horizontal scanning circuit 40 supplies the column circuit 30 with control signals used for sequentially outputting the processed signals from the column circuit 30 to the output circuit 50. The output circuit 50 outputs a signal input from the column circuit 30 to a storage device or a signal processing device outside the photoelectric conversion device 1 in a predetermined format.

FIG. 2 is a circuit diagram of the pixels 11 according to the present embodiment. As illustrated in FIG. 2, the pixel 11 has photoelectric conversion units PDA, PDB, PDC, transfer transistors M1A, M1B, M1C, a reset transistor M2, an amplifier transistor M3, and a selection transistor M4.

The photoelectric conversion units PDA, PDB, PDC each are a photodiode, for example. The anodes of the photoelectric conversion units PDA, PDB, PDC are connected to a ground node. The cathodes of the photoelectric conversion units PDA, PDB, PDC are connected to the sources of the transfer transistors M1A, M1B, M1C, respectively. The drains of the transfer transistors M1A, M1B, M1C are connected to the source of the reset transistor M2 and the gate of the amplifier transistor M3. The node at which the drains of the transfer transistors M1A, M1B, M1C, the source of the reset transistor M2, and the gate of the amplifier transistor M3 are connected is a floating diffusion FD. The floating diffusion FD includes a capacitance component (floating diffusion capacitance) and has a function as a charge holding part. The floating diffusion capacitance includes a parasitic capacitance of an electrical path from the transfer transistors M1A, M1B, M1C to the amplifier transistor M3 via the floating diffusion FD. In FIG. 2, this floating diffusion capacitance is illustrated equivalently by a circuit symbol of a capacitor element.

The drain of the reset transistor M2 and the drain of the amplifier transistor M3 are connected to the power source voltage node supplied with a voltage VDD. The source of the amplifier transistor M3 is connected to the drain of the selection transistor M4. The source of the selection transistor M4 is connected to the signal line 12. The signal line 12 is connected to a current source (not illustrated). This current source may be a current source having a variable current value or may be a constant current source having a constant current value.

The scan lines 13A, 13B, 13C are connected to the gates of the transfer transistors M1A, M1B, M1C, respectively. The scan line 14 is connected to the gate of the reset transistor M2. The scan line 15 is connected to the gate of the selection transistor M4. With such a configuration, control signals from the vertical scanning circuit 20 are input to the gates of the transfer transistors M1A, M1B, M1C, the reset transistor M2, and the selection transistor M4. Note that a plurality of pixels 11 on the same row are connected to the common signal line and controlled simultaneously by the common control signal.

In the present embodiment, each transistor forming the pixel 11 is an N-type MOS transistor. Therefore, when a high-level control signal is supplied from the vertical scanning circuit 20, a corresponding transistor is switched on. Further, when a low-level control signal is supplied from the vertical scanning circuit 20, a corresponding transistor is switched off. Further, names of the source and the drain of a MOS transistor may differ in accordance with the conductivity type of the transistor or a function of interest. Some or all of the names of the source and the drain used in the present embodiment may be denoted as the opposite names.

The photoelectric conversion units PDA, PDB, PDC convert (photoelectrically convert) incident light into charges, the quantity of which corresponds to the amount of the incident light. When switched on, the transfer transistor M1A (first transfer transistor) transfers charges held by the photoelectric conversion unit PDA (first photoelectric conversion unit) to the floating diffusion FD. When switched on, the transfer transistor M1B (second transfer transistor) transfers charges held by the photoelectric conversion unit PDB (second photoelectric conversion unit) to the floating diffusion FD. When switched on, the transfer transistor M1C (third transfer transistor) transfers charges held by the photoelectric conversion unit PDC (third photoelectric conversion unit) to the floating diffusion FD. The charges transferred from the photoelectric conversion units PDA, PDB, PDC are held by the capacitor of the floating diffusion FD (floating diffusion capacitor). As a result, the floating diffusion FD has a potential in accordance with the quantity of charges transferred from the photoelectric conversion units PDA, PDB, PDC by the charge-to-voltage conversion due to the floating diffusion capacitance.

When switched on, the selection transistor M4 connects the amplifier transistor M3 to the signal line 12. The amplifier transistor M3 is configured such that the voltage VDD is supplied to the drain and bias current is supplied to the source from a current source via the selection transistor M4 and forms an amplifier unit in which the gate is the input node (source follower circuit). Accordingly, the amplifier transistor M3 outputs a signal based on the potential of the floating diffusion FD to the signal line 12 via the selection transistor M4. In this sense, the amplifier transistor M3 and the selection transistor M4 correspond to an output unit that outputs a pixel signal in accordance with the quantity of charges held in the floating diffusion FD.

The reset transistor M2 has a function of controlling supply of the voltage (voltage VDD) to the floating diffusion FD to reset the floating diffusion FD. When switched on, the reset transistor M2 resets the floating diffusion FD to a voltage in accordance with the voltage VDD.

Figure 3A:
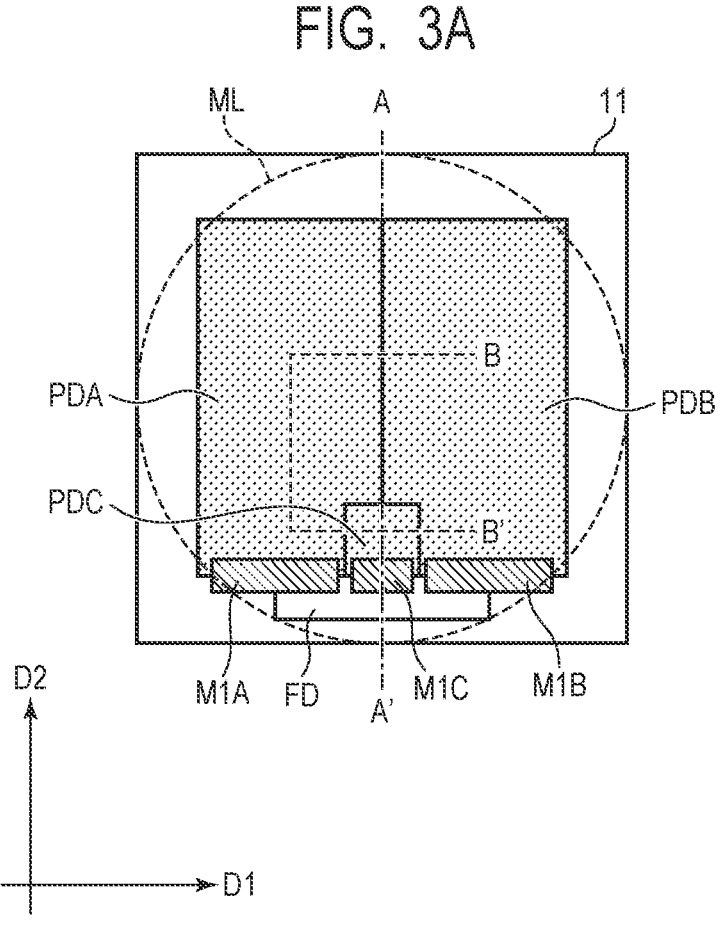
FIG. 3A and FIG. 3B are schematic plan views of the pixel according to the first embodiment.
Figure 3B:
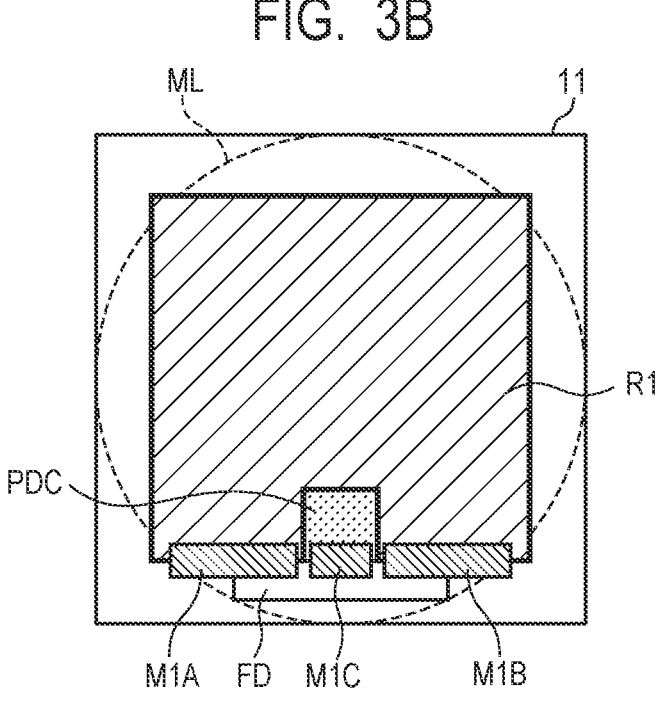

FIG. 3A and FIG. 3B are schematic plan views of the pixel 11 according to the present embodiment. FIG. 3A schematically illustrates the arrangement of the photoelectric conversion units PDA, PDB, PDC, the floating diffusion FD, and respective transistors in the plan view. In FIG. 3A, the regions labeled with "PDA", "PDB", and "PDC" represent regions in which semiconductor regions of photodiodes forming the photoelectric conversion units PDA, PDB, and PDC are formed, respectively. In FIG. 3A, the region labeled with "FD" represents a region in which a semiconductor region forming the floating diffusion FD is formed. In FIG. 3A, the regions labeled with "M1A", "M1B", and "M1C" represent regions in which the gate electrodes of the transfer transistors M1A, M1B, and M1C are arranged, respectively. The dashed line labeled with "ML" represents a location where a microlens ML that guides incident light to the photoelectric conversion units PDA, PDB, PDC is arranged. In such a way, the microlens ML is arranged commonly to the three photoelectric conversion units PDA, PDB, PDC.

As illustrated in FIG. 3A, the area of the photoelectric conversion unit PDC is smaller than the area of the photoelectric conversion unit PDA and smaller than the area of the photoelectric conversion unit PDB. Accordingly, the sensitivity of the photoelectric conversion unit PDC is lower than the sensitivity of the photoelectric conversion unit PDA and lower than the sensitivity of the photoelectric conversion unit PDB. Therefore, the photoelectric conversion device 1 of the present embodiment can output signals based on charges accumulated in the photoelectric conversion units PDA, PDB having high sensitivity and a signal based on charges accumulated in the photoelectric conversion unit PDC having low sensitivity. A high-dynamic range can be achieved by using these two types of signals to perform signal processing. For example, by combining these two types of signals, it is possible to generate a high-dynamic range image. Further, due to the relationship of the areas described above, the saturated charge amount of the photoelectric conversion unit PDC is smaller than the saturated charge amount of the photoelectric conversion unit PDA and smaller than the saturated charge amount of the photoelectric conversion unit PDB.

Further, the photoelectric conversion unit PDA and the photoelectric conversion unit PDB are arranged to be substantially line-symmetrical with respect to the line segment A-A' parallel to a direction D2 (second direction). In other words, the photoelectric conversion unit PDA and the photoelectric conversion unit PDB are arranged so as to be aligned in a direction D1 (first direction). This enables the photoelectric conversion device 1 of the present embodiment to output a signal based on charges accumulated in the photoelectric conversion unit PDA and a signal based on charges accumulated in the photoelectric conversion unit PDB. Phase difference detection in the direction D1 can be performed by using these two types of signals to perform signal processing. For example, ranging can be performed based on a phase difference between these two types of signals.

FIG. 3B depicts a region R1 including the photoelectric conversion unit PDA and the photoelectric conversion unit PDB in the same schematic plan view as FIG. 3A. The photoelectric conversion unit PDC is arranged along a part of the outer circumference of the region R1. Accordingly, all the transfer transistors M1A, M1B, M1C and the floating diffusion FD can be arranged in the periphery of the pixel 11. Further, the centroid position of the photoelectric conversion unit PDC differs from the centroid position of the photoelectric conversion unit PDA and the centroid position of the photoelectric conversion unit PDB in the direction D2 orthogonal to the direction D1. Accordingly, the amount of light entering the transfer transistor M1A, M1B, M1C or the floating diffusion FD is reduced compared to a configuration in which they are arranged near the center of the pixel 11. Therefore, a signal loss due to light entering the transfer transistor M1A, M1B, M1C or the floating diffusion FD can be reduced. Note that the centroid position of a photoelectric conversion unit refers to the geometric center in a planar shape of a semiconductor region forming the photoelectric conversion unit.

Figure 4:
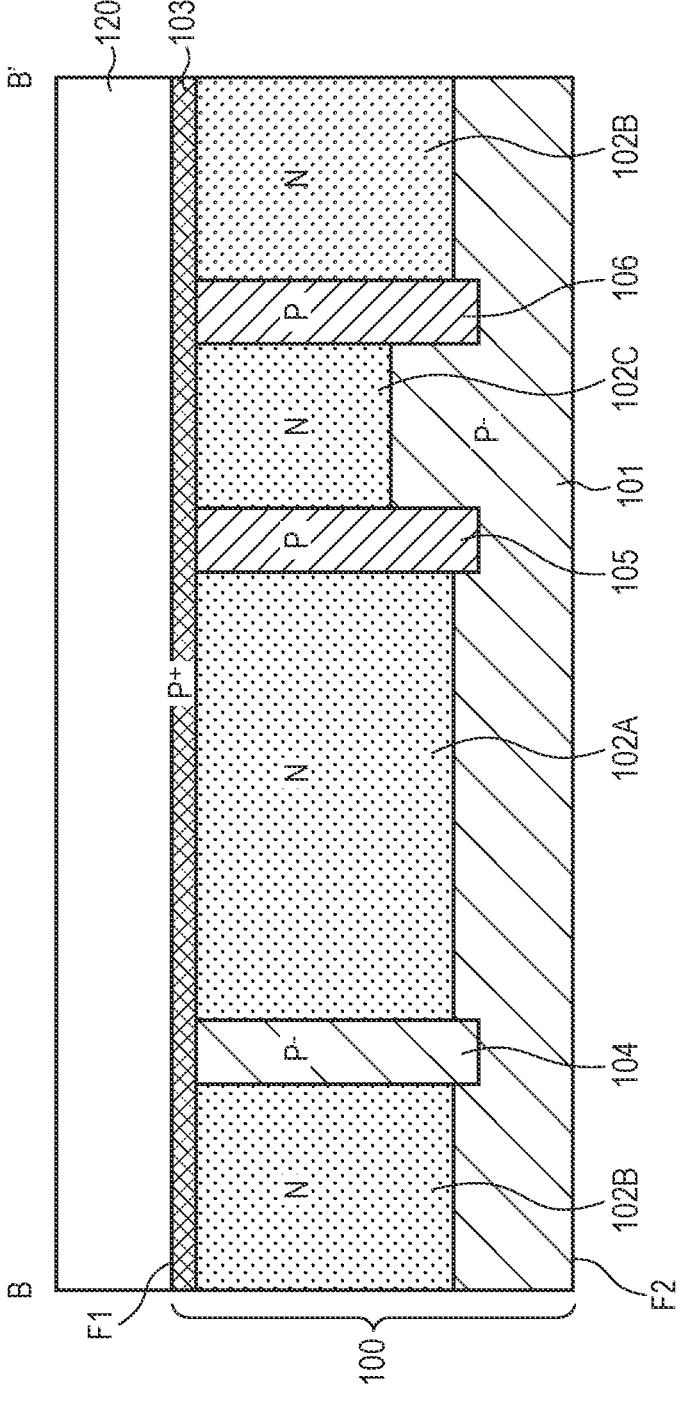
FIG. 4 is a schematic sectional view of the pixel according to the first embodiment.

FIG. 4 is a schematic sectional view of the pixel 11 according to the present embodiment. FIG. 4 schematically illustrates a cross section taken along the line B-B' of FIG. 3A. In a semiconductor substrate 100 in which the pixels 11 are formed, a face on the side of a wiring layer 120 including the scan lines 13A, 13B, 13C, 14, 15, and the like being arrange (the upper face in FIG. 4) is denoted as a first face F1. Further, a face on the opposite side from the first face F1 (the lower face in FIG. 4) is denoted as a second face F2. In the present embodiment, incident light enters the pixel from the first face F1 side. Further, in the present embodiment, the depth direction refers to a direction from the first face toward the second face. Note that, in FIG. 4, although depiction of the microlens ML is omitted, the microlens ML is arranged over the wiring layer 120, that is, on the first face F1 side of the semiconductor substrate 100.

P-type semiconductor regions 101, 103, 104, 105, 106 and N-type semiconductor regions 102A, 102B, 102C are arranged inside the semiconductor substrate 100. The P-type semiconductor region 101 is a well region. The N-type semiconductor regions 102A, 102B, 102C (first semiconductor region) are arranged at positions shallower than the P-type semiconductor region 101 (second semiconductor region) (positions closer to the first face F1). Each of the N-type semiconductor regions 102A, 102B, 102C and the P-type semiconductor region 101 form a photodiode. The N-type semiconductor region 102A and the P-type semiconductor region 101 correspond to the photoelectric conversion unit PDA. The N-type semiconductor region 102B and the P-type semiconductor region 101 correspond to the photoelectric conversion unit PDB. The N-type semiconductor region 102C and the P-type semiconductor region 101 correspond to the photoelectric conversion unit PDC.

The P-type semiconductor region 103 is formed in contact with the first face F1 and has a higher impurity concentration than the remaining P-type semiconductor regions. The P-type semiconductor region 103 reduces influence of dark electrons occurring on the first face.

The P-type semiconductor region 104 is an isolation part (first isolation part) formed between the N-type semiconductor region 102A and the N-type semiconductor region 102B. The P-type semiconductor region 105 is an isolation part (second isolation part) formed between the N-type semiconductor region 102A and the N-type semiconductor region 102C. The P-type semiconductor region 106 is an isolation part (third isolation part) formed between the N-type semiconductor region 102B and the N-type semiconductor region 102C. The impurity concentration of the P-type semiconductor region 105 is higher than the impurity concentration of the P-type semiconductor region 104. Further, the impurity concentration of the P-type semiconductor region 106 is higher than the impurity concentration of the P-type semiconductor region 104. This makes it possible that inflow of charges from the photoelectric conversion unit PDA or the photoelectric conversion unit PDB to the photoelectric conversion unit PDC is less likely to occur in a situation where a large number of charges are generated in the photoelectric conversion units PDA and PDB having high sensitivity, such as when a high intensity subject is captured.

Further, the bottom face of the N-type semiconductor region 102C is formed at a position shallower than the bottom face of the N-type semiconductor region 102A and the bottom face of the N-type semiconductor region 102B. That is, the thickness of the N-type semiconductor region 102C is smaller than the thickness of the N-type semiconductor region 102A and smaller than the thickness of the N-type semiconductor region 102B. This makes it possible that charges occurring at a deep part of the semiconductor substrate 100 are less likely to flow into the N-type semiconductor region 102C. This can further reduce the sensitivity of the photoelectric conversion unit PDC.

In the photoelectric conversion device 1 of the present embodiment, the photoelectric conversion unit PDC is arranged along a part of the outer circumference of the region R1 including the photoelectric conversion unit PDA and the photoelectric conversion unit PDB. Accordingly, the transfer transistors M1A, M1B, M1C and the floating diffusion FD are arranged in the periphery of the pixel 11, and a loss due to incidence of light thereto is reduced. Therefore, according to the present embodiment, the photoelectric conversion device 1 with a reduced signal loss is provided.

Second Embodiment

The second embodiment will be described with reference to FIG. 5 to FIG. 8. In the present embodiment, the number of photoelectric conversion units is increased to four from three compared to the configuration of the pixel 11 of the first embodiment. Although features different from the first embodiment will be mainly described below, description of elements common to the first embodiment may be omitted or simplified.

Figure 5:
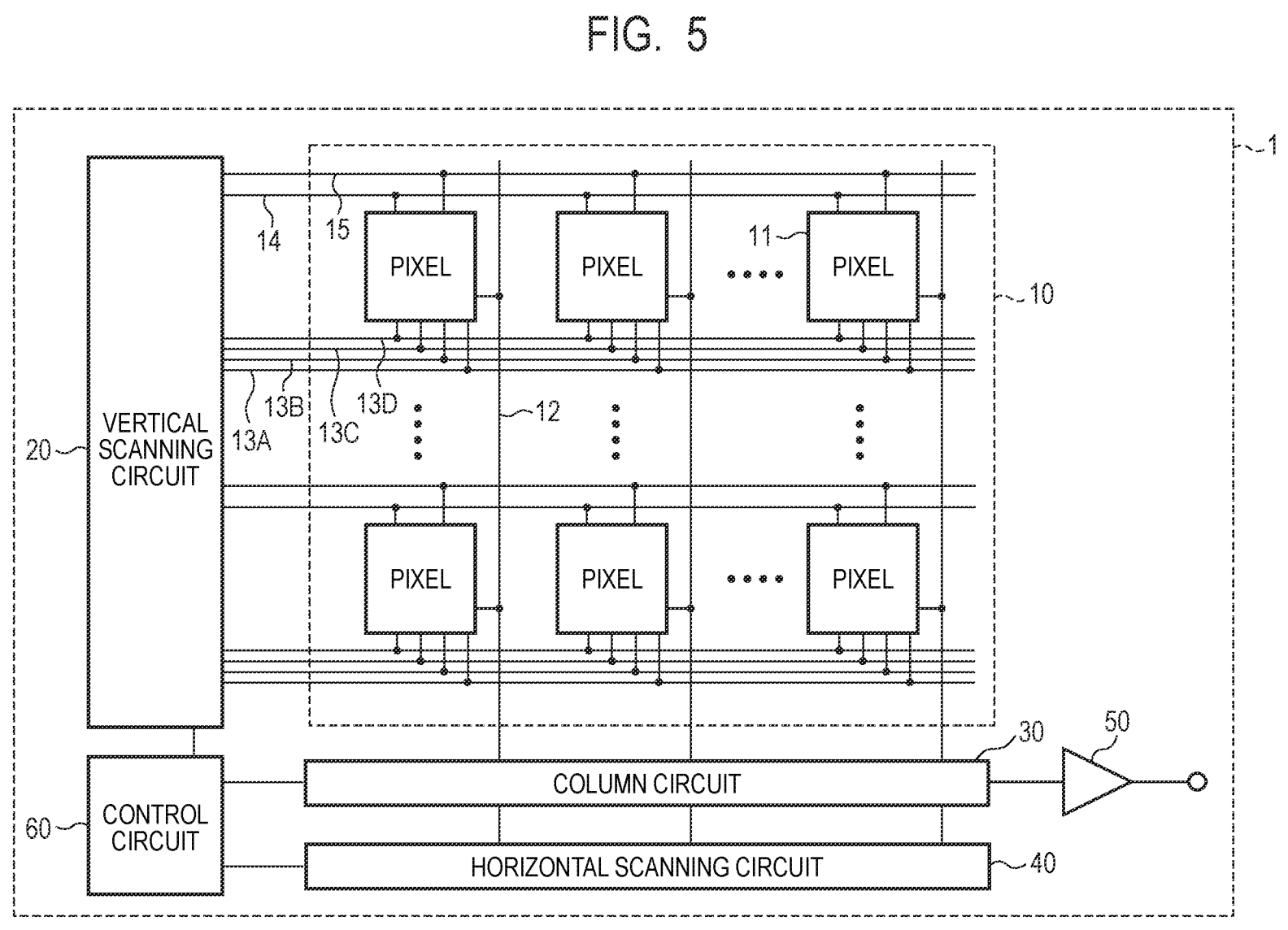

FIG. 5 is a block diagram illustrating the general configuration of the photoelectric conversion device 1 according to the present embodiment. In the present embodiment, a scan line 13D is further arranged. The scan line 13D is connected to a plurality of pixels 11 aligned in the row direction to form a scan line common to these pixels 11. The scan line 13D is connected to the vertical scanning circuit 20.

Figure 6:
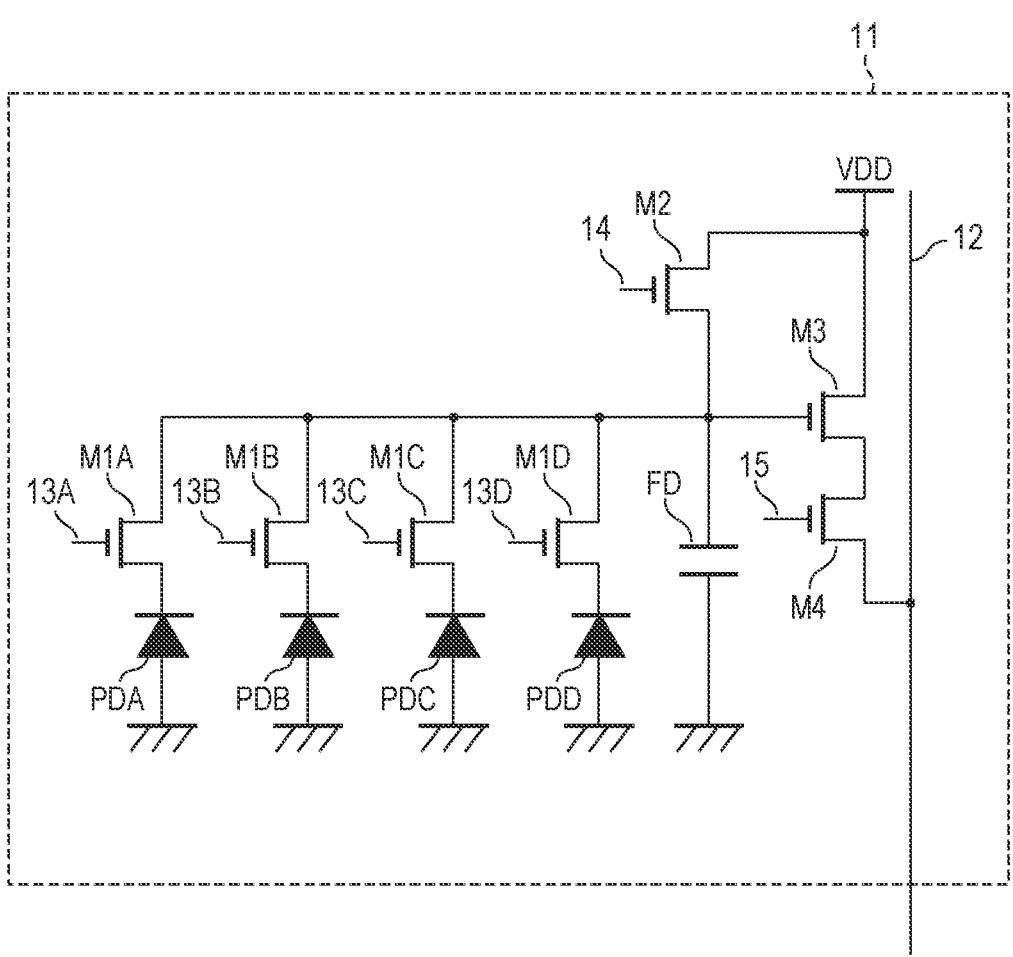
FIG. 6 is a circuit diagram of a pixel according to the second embodiment.

FIG. 6 is a circuit diagram of the pixel 11 according to the present embodiment. As illustrated in FIG. 6, the pixel 11 further has a photoelectric conversion unit PDD and a transfer transistor M1D in addition to the configuration of FIG. 2.

The photoelectric conversion unit PDD is a photodiode, for example. The anode of the photoelectric conversion unit PDD is connected to the ground node. The cathode of the photoelectric conversion unit PDD is connected to the source of the transfer transistor M1D. The drain of the transfer transistor M1D is connected to the node of the floating diffusion FD. The scan line 13D is connected to the gate of the transfer transistor M1D. A control signal from the vertical scanning circuit 20 is input to the gate of the transfer transistor M1D. The transfer transistor M1D (fourth transfer transistor) is switched on based on the control signal and transfers charges held by the photoelectric conversion unit PDD (fourth photoelectric conversion unit) to the floating diffusion FD.

Figure 7A:
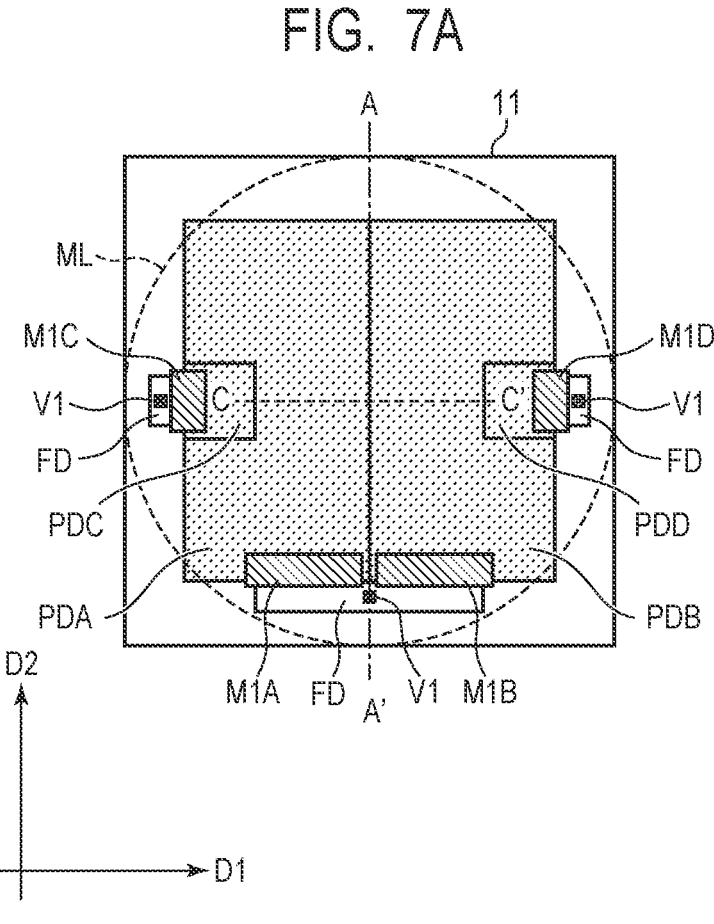
FIG. 7A and FIG. 7B are schematic plan views of the pixel according to the second embodiment.
Figure 7B:
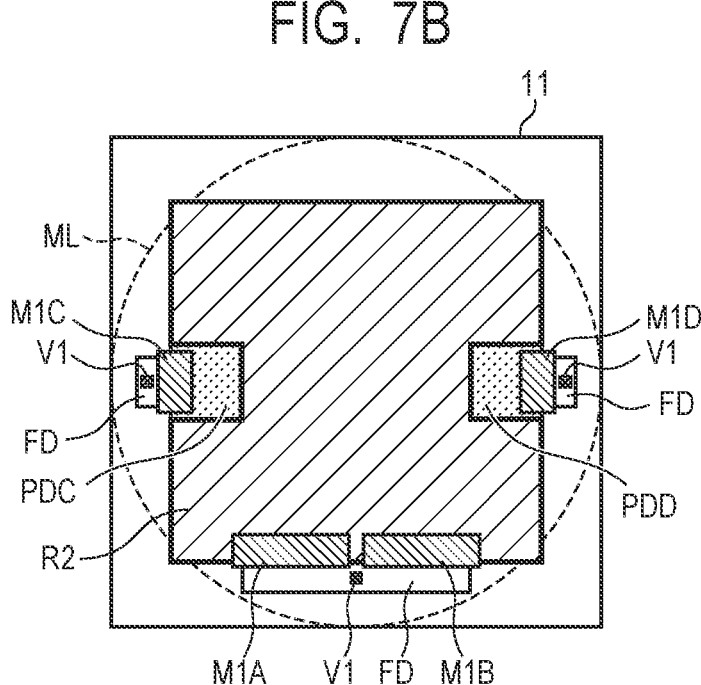

FIG. 7A and FIG. 7B are schematic plan views of the pixel 11 according to the present embodiment. FIG. 7A schematically illustrates the arrangement of the photoelectric conversion units PDA, PDB, PDC, PDD, floating diffusions FD, and respective transistors in the plan view. The region labeled with "PDD" represents a region in which a semiconductor region of a photodiode forming the photoelectric conversion unit PDD is formed. The region labeled with "MILD" represents a region in which the gate electrode of the transfer transistors M1D is arranged. The microlens ML is arranged commonly to the four photoelectric conversion units PDA, PDB, PDC, PDD. Three vias V1 are arranged to three floating diffusions FD, respectively. The vias V1 are connected to wirings arranged in the wiring layer 120, and the three floating diffusions FD are electrically connected to each other via the wirings.

As illustrated in FIG. 7A, each area of the photoelectric conversion units PDC, PDD is smaller than the area of the photoelectric conversion unit PDA and smaller than the area of the photoelectric conversion unit PDB. Accordingly, the sensitivity of the photoelectric conversion units PDC, PDD is lower than the sensitivity of the photoelectric conversion unit PDA and lower than the sensitivity of the photoelectric conversion unit PDB. Therefore, the photoelectric conversion device 1 of the present embodiment can output signals based on charges accumulated in the photoelectric conversion units PDA, PDB having high sensitivity and signals based on charges accumulated in the photoelectric conversion units PDC, PDD having low sensitivity. A high-dynamic range can be achieved by using these two types of signals to perform signal processing in the same manner as in the first embodiment. Further, due to the relationship of the areas described above, the saturated charge amount of the photoelectric conversion units PDC, PDD is smaller than the saturated charge amount of the photoelectric conversion units PDA and smaller than the saturated charge amount of the photoelectric conversion unit PDB.

Further, the photoelectric conversion unit PDA and the photoelectric conversion unit PDB are arranged to be substantially line-symmetrical with respect to the line segment A-A' parallel to the direction D2. In other words, the photoelectric conversion unit PDA and the photoelectric conversion unit PDB are arranged so as to be aligned in the direction D1. Furthermore, the photoelectric conversion unit PDC and the photoelectric conversion unit PDD are also arranged to be substantially line-symmetrical with respect to the line segment A-A' parallel to the direction D2. In other words, the photoelectric conversion unit PDC and the photoelectric conversion unit PDD are also arranged so as to be aligned in the direction D1. In addition to phase difference detection being made possible by two signals based on the photoelectric conversion unit PDA and the photoelectric conversion unit PDB in the same manner as the first embodiment, phase difference detection can be performed by two signals based on the photoelectric conversion unit PDC and the photoelectric conversion unit PDD in the present embodiment. In the present embodiment, phase difference detection can be performed by using two signals based on the photoelectric conversion unit PDC and the photoelectric conversion unit PDD having low sensitivity even in a situation where saturation of the charges of the photoelectric conversion unit PDA and the photoelectric conversion unit PDB may occur, such as when a high-intensity subject is captured. Thus, even when a subject is of high intensity, phase difference detection can be performed more accurately.

FIG. 7B depicts a region R2 including the photoelectric conversion unit PDA and the photoelectric conversion unit PDB in the same schematic plan view as FIG. 7A. The photoelectric conversion units PDC, PDD are arranged along a part of the outer circumference of the region R2. Accordingly, all the transfer transistors M1A, M1B, M1C, M1D and the floating diffusion FD can be arranged in the periphery of the pixel 11. Further, the distance between the centroid position of the photoelectric conversion unit PDC and the centroid position of the photoelectric conversion unit PDB is larger than the distance between the centroid position of the photoelectric conversion unit PDC and the centroid position of the photoelectric conversion unit PDA in the direction D1. Accordingly, the amount of light entering the transfer transistor M1A, M1B, M1C, M1D or the floating diffusion FD is reduced compared to a configuration in which they are arranged near the center of the pixel 11. Therefore, a signal loss due to light entering the transfer transistor M1A, M1B, M1C, M1D or the floating diffusion FD can be reduced.

Figure 8:
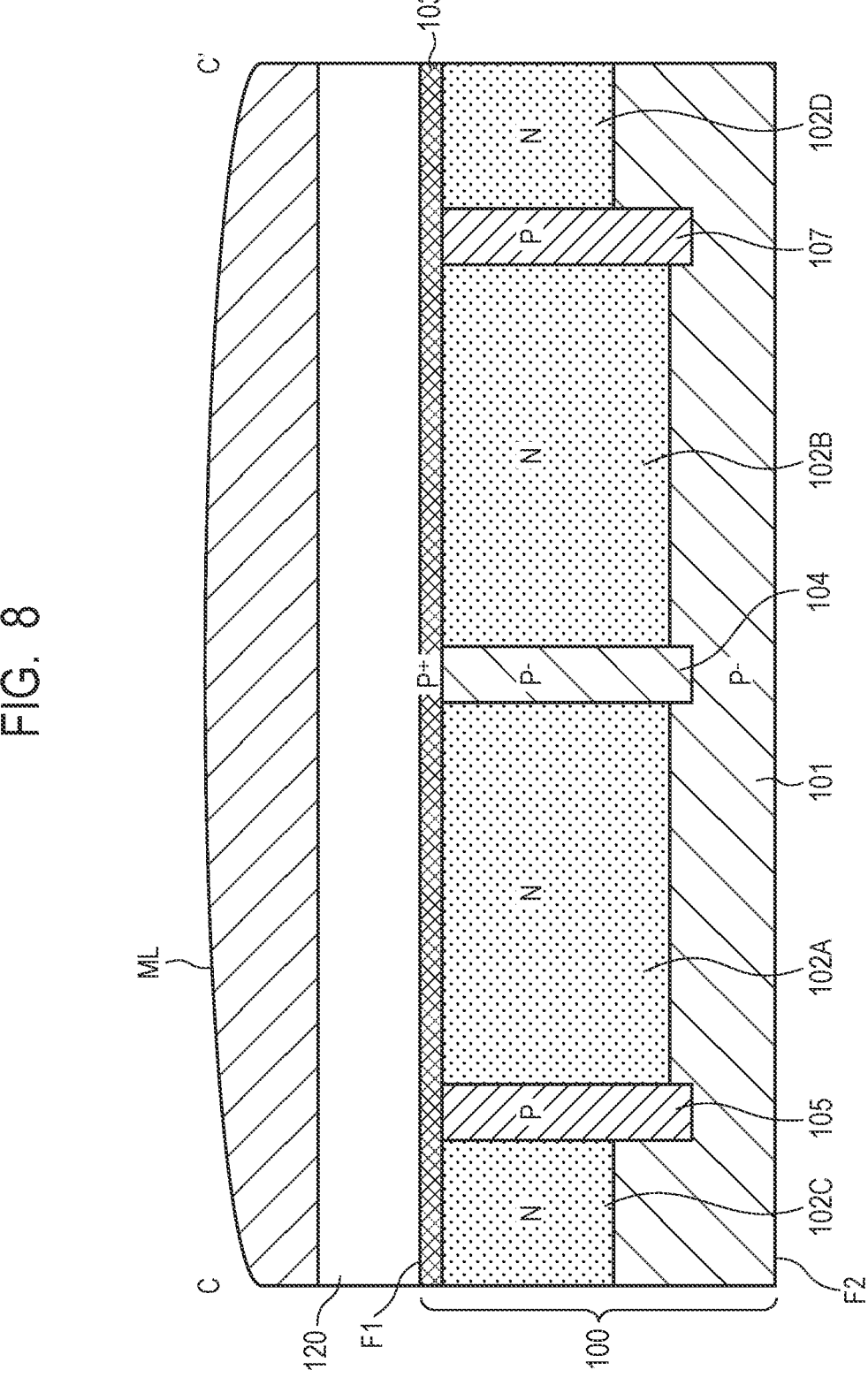
FIG. 8 is a schematic sectional view of the pixel according to the second embodiment.

FIG. 8 is a schematic sectional view of the pixel 11 according to the present embodiment. FIG. 8 schematically illustrates a cross section taken along the line C-C' of FIG. 7A. The P-type semiconductor regions 101, 103, 104, 105, 107 and the N-type semiconductor regions 102A, 102B, 102C, 102D are arranged inside the semiconductor substrate 100. The N-type semiconductor region 102D is arranged at a position shallower than the P-type semiconductor region 101 (the position closer to the first face F1). The N-type semiconductor region 102D and the P-type semiconductor region 101 form a photodiode. The N-type semiconductor region 102D and the P-type semiconductor region 101 correspond to the photoelectric conversion unit PDD. The wiring layer 120 and the microlens ML are arranged on the first face F1 side of the semiconductor substrate 100.

The P-type semiconductor region 107 is an isolation part formed between the N-type semiconductor region 102B and the N-type semiconductor region 102D. The impurity concentration of the P-type semiconductor region 107 is higher than the impurity concentration of the P-type semiconductor region 104. This makes it possible that inflow of charges from the photoelectric conversion unit PDA to the photo-electric conversion unit PDC and charges from the photo-electric conversion unit PDB to the photoelectric conversion unit PDD is less likely to occur in a situation where a large number of charges are generated in the photoelectric con-version units PDA and PDB having high sensitivity, such as when a high intensity subject is captured.

Further, the bottoms face of the N-type semiconductor regions 102C, 102D are formed at a position shallower than the bottom face of the N-type semiconductor region 102A and the bottom face of the N-type semiconductor region 102B. That is, each thickness of the N-type semiconductor regions 102C, 102D is smaller than the thickness of the N-type semiconductor region 102A and smaller than the thickness of the N-type semiconductor region 102B. This makes it possible that charges occurring at a deep part of the semiconductor substrate 100 are less likely to flow into the N-type semiconductor regions 102C, 102D. This can further reduce the sensitivity of the photoelectric conversion units PDC, PDD.

In the photoelectric conversion device 1 of the present embodiment, the photoelectric conversion units PDC, PDD are arranged along a part of the outer circumference of the region R2 including the photoelectric conversion unit PDA and the photoelectric conversion unit PDB. Accordingly, the transfer transistors M1A, M1B, M1C, M1D and the floating diffusion FD are arranged in the periphery of the pixel 11, and a loss due to incidence of light thereto is reduced. Therefore, according to the present embodiment, the pho-toelectric conversion device 1 with a reduced signal loss is provided.

Third Embodiment

The third embodiment will be described with reference to FIG. 9. In the present embodiment, each of the transfer transistors M1A, M1B in the pixel 11 of the second embodi-ment is divided and connected in parallel. Although features different from the second embodiment will be mainly described below, description of elements common to the second embodiment may be omitted or simplified.

Figure 9:
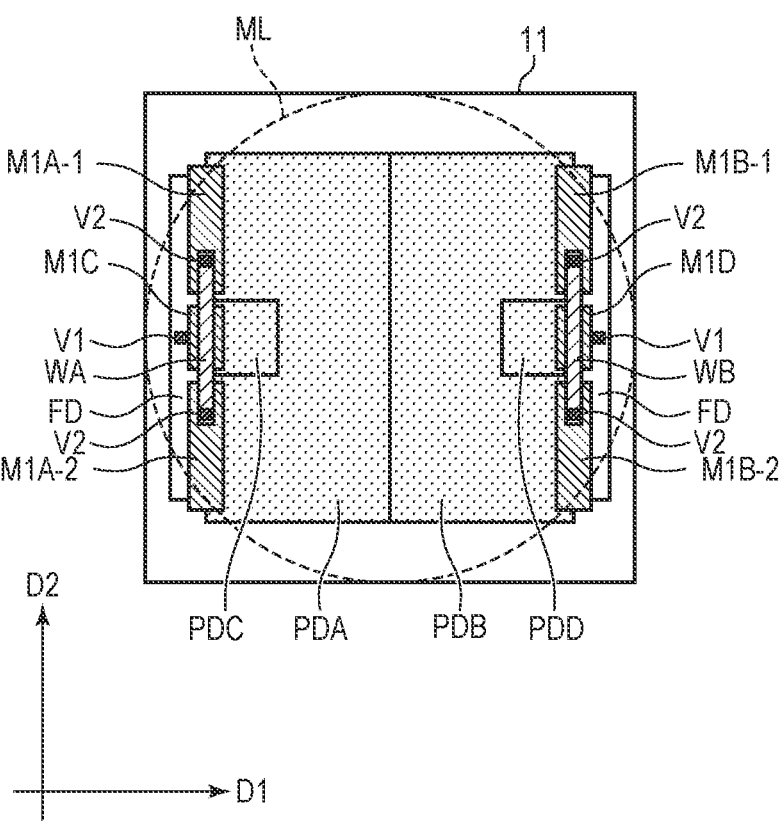
FIG. 9 is a schematic plan view of a pixel according to a third embodiment.

FIG. 9 is a schematic plan view of the pixel 11 according to the present embodiment. As illustrated in FIG. 9, in the present embodiment, the transfer transistor M1A in the second embodiment is divided into two transfer transistors M1A-1, M1A-2 connected in parallel. The transfer transis-tors M1A-1, M1A-2 are aligned along the end of the photoelectric conversion unit PDA. The gate electrodes of the transfer transistors M1A-1, M1A-2 are short-circuited via a via V2 and a connection wiring WA. Similarly, in the present embodiment, the transfer transistor M1B in the second embodiment is divided into two transfer transistors M1B-1, M1B-2 connected in parallel. The transfer transis-tors M1B-1, M1B-2 are aligned along the end of the photoelectric conversion unit PDB. The gate electrodes of the transfer transistors M1B-1, M1B-2 are short-circuited via a via V2 and a connection wiring WB.

In the configuration of the present embodiment, the trans-fer transistors are connected in parallel. This achieves an advantageous effect of an effectively increased gate width of the transfer transistor. Therefore, the charge transfer rate when charges are transferred from the photoelectric conver-sion units PDA, PDB to the floating diffusion FD is increased compared to the configuration of the second embodiment. Therefore, according to the present embodi-ment, the photoelectric conversion device 1 that may increase the charge transfer rate in addition to having the advantageous effect described in the second embodiment is provided. Note that, although the configuration in which two transfer transistors are connected in parallel is employed in the present embodiment, three or more transfer transistors may be connected in parallel.

Fourth Embodiment

The fourth embodiment will be described with reference to FIG. 10A and FIG. 10B. In the present embodiment, each of the transfer transistors M1C, M1D and the photoelectric conversion unit PDC, PDD in the pixel 11 of the second embodiment is divided and connected in parallel. Although features different from the second embodiment will be mainly described below, description of elements common to the second embodiment may be omitted or simplified.

Figures 10A, 10B:
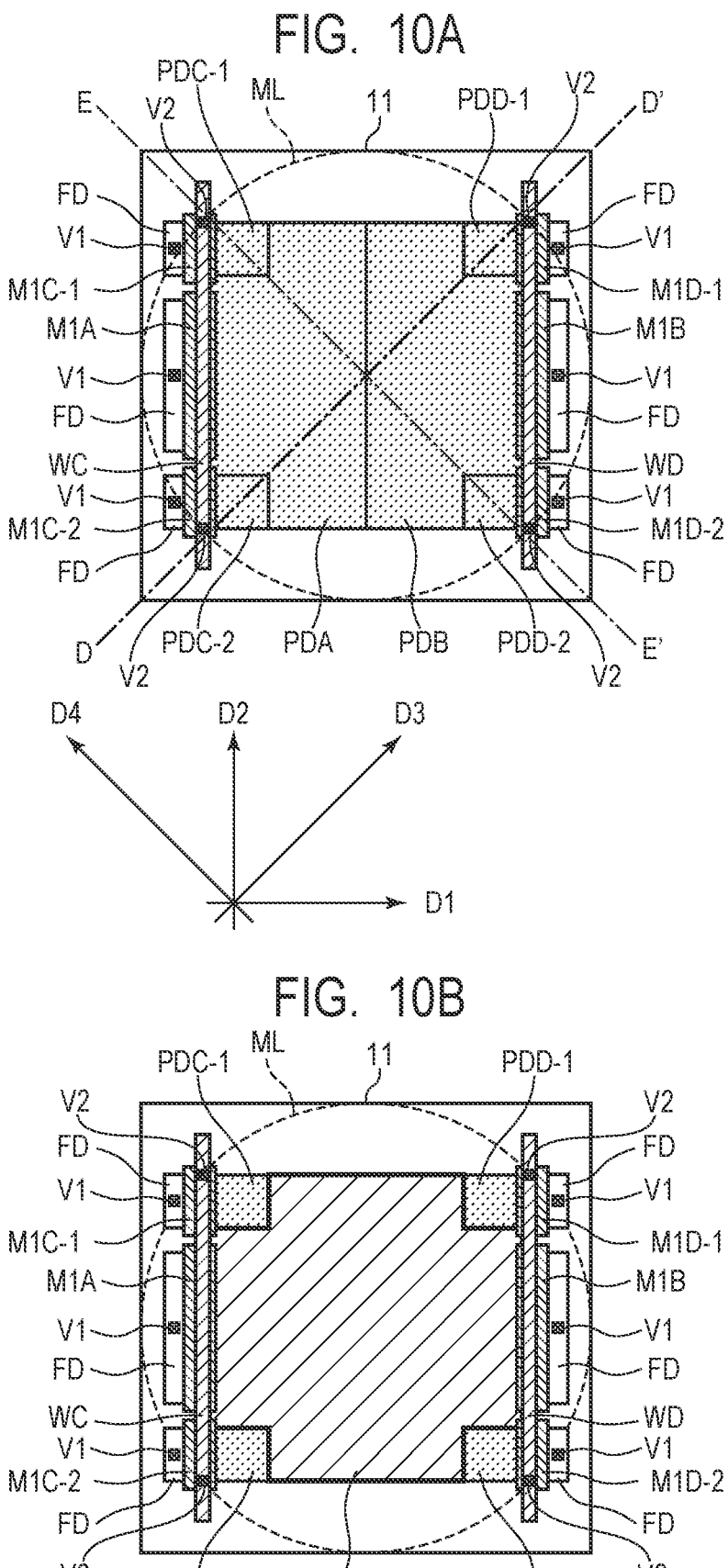
FIG. 10A and FIG. 10B are schematic plan views of a pixel according to a fourth embodiment.

FIG. 10A is a schematic plan view of the pixel 11 according to the present embodiment. As illustrated in FIG. 10A, the photoelectric conversion unit PDC in the second embodiment is divided into two photoelectric conversion units PDC-1, PDC-2 connected in parallel. Further, the transfer transistor M1C in the second embodiment is divided into two transfer transistors M1C-1, M1C-2 connected in parallel. The gate electrodes of the transfer transistors M1C-1, M1C-2 are short-circuited via a via V2 and a connection wiring WC. Similarly, the photoelectric conversion unit PDD in the second embodiment is divided into two photo-electric conversion units PDD-1, PDD-2 connected in par-allel. Further, the transfer transistor M1D in the second embodiment is divided into two transfer transistors M1D-1, M1D-2 connected in parallel. The gate electrodes of the transfer transistors M1D-1, M1D-2 are short-circuited via a via V2 and a connection wiring WD.

As illustrated in FIG. 10A, the photoelectric conversion unit PDC-1 and the photoelectric conversion unit PDD-2 are arranged to be substantially line-symmetrical with respect to the line segment D-D' parallel to a direction D3 (third direction) between the direction D1 and the direction D2. In other words, the photoelectric conversion unit PDC-1 and the photoelectric conversion unit PDD-2 are arranged so as to be aligned in a direction D4 intersecting the direction D3. Further, the photoelectric conversion unit PDC-2 and the photoelectric conversion unit PDD-1 are arranged to be substantially line-symmetrical with respect to the line seg-ment E-E' parallel to a direction D4. In other words, the photoelectric conversion unit PDC-2 and the photoelectric conversion unit PDD-1 are arranged so as to be aligned in the direction D3.

According to the configuration of the present embodi-ment, light that has traveled in the direction D3 or the direction D4 and entered the pixel 11 is more likely to enter the photoelectric conversion units PDC-1, PDC-2, PDD-1, PDD-2 than in the configuration of the second embodiment. Therefore, phase difference detection in the direction D3 or the direction D4 can be performed by using a signal based on charges accumulated in the photoelectric conversion units PDC-1, PDC-2, PDD-1, PDD-2 to perform signal processing.

FIG. 10B depicts a region R3 including the photoelectric conversion unit PDA and the photoelectric conversion unit PDB in the same schematic plan view as FIG. 10A. The photoelectric conversion units PDC-1, PDC-2, PDD-1, PDD-2 are arranged along a part of the outer circumference of the region R3. Accordingly, all the transfer transistors M1A, M1B, M1C-1, M1C-2, M1D-1, M1D-2 and the float-ing diffusion FD can be arranged in the periphery of the pixel 11. This reduces the amount of light entering the transfer transistor M1A, M1B, M1C-1, M1C-2, M1D-1, M1D-2 or the floating diffusion FD compared to a configuration in which they are arranged near the center of the pixel 11. Therefore, a signal loss due to light entering the transfer transistor M1A, M1B, M1C-1, M1C-2, M1D-1, M1D-2 or the floating diffusion FD can be reduced.

According to the present embodiment, the photoelectric conversion device 1 that can perform phase difference detection in the direction D3 or the direction D4 in addition to having the advantageous effect described in the second embodiment is provided.

Fifth Embodiment

The fifth embodiment will be described with reference to FIG. 11A and FIG. 11B. In the present embodiment, the photoelectric conversion unit PDC and the photoelectric conversion unit PDD of the second embodiment are modified so as to be aligned in the direction D2. Although features different from the second embodiment will be mainly described below, description of elements common to the second embodiment may be omitted or simplified.

Figure 11A:
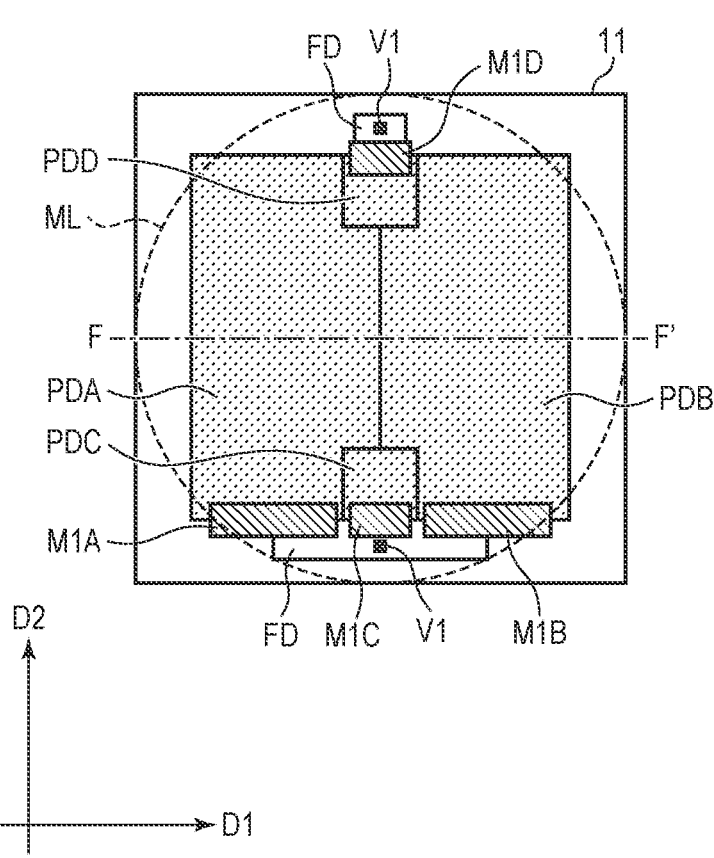
FIG. 11A and FIG. 11B are schematic plan views of a pixel according to a fifth embodiment.

FIG. 11A is a schematic plan view of the pixel 11 according to the present embodiment. As illustrated in FIG. 11A, the photoelectric conversion unit PDC and the photoelectric conversion unit PDD are arranged to be substantially line-symmetrical with respect to the line segment F-F' parallel to the direction D1. In other words, the photoelectric conversion unit PDC and the photoelectric conversion unit PDD are arranged so as to be aligned in the direction D2. According to the present embodiment, phase difference detection parallel to the direction D2 can be performed by using two signals based on the photoelectric conversion unit PDC and the photoelectric conversion unit PDD.

Figure 11B:
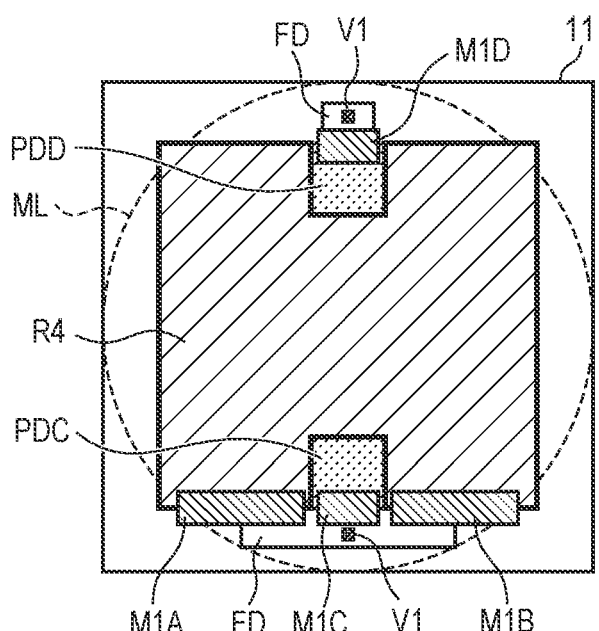

FIG. 11B depicts a region R4 including the photoelectric conversion unit PDA and the photoelectric conversion unit PDB in the same schematic plan view as FIG. 11A. The photoelectric conversion units PDC, PDD are arranged along a part of the outer circumference of the region R4. Accordingly, all the transfer transistors M1A, M1B, M1C, M1D and the floating diffusion FD can be arranged in the periphery of the pixel 11. This reduces the amount of light entering the transfer transistor M1A, M1B, M1C, M1D or the floating diffusion FD compared to a configuration in which they are arranged near the center of the pixel 11. Therefore, a signal loss due to light entering the transfer transistor M1A, M1B, M1C, M1D or the floating diffusion FD can be reduced.

According to the present embodiment, the photoelectric conversion device 1 that can perform phase difference detection in the direction D2 in addition to having the advantageous effect described in the second embodiment is provided.

Sixth Embodiment

The sixth embodiment will be described with reference to FIG. 12, FIG. 13A, and FIG. 13B. In the present embodiment, a single floating diffusion FD is shared by eight photoelectric conversion units in the pixel 11. Although features different from the fifth embodiment will be mainly described below, description of elements common to the fifth embodiment may be omitted or simplified.

Figure 12:
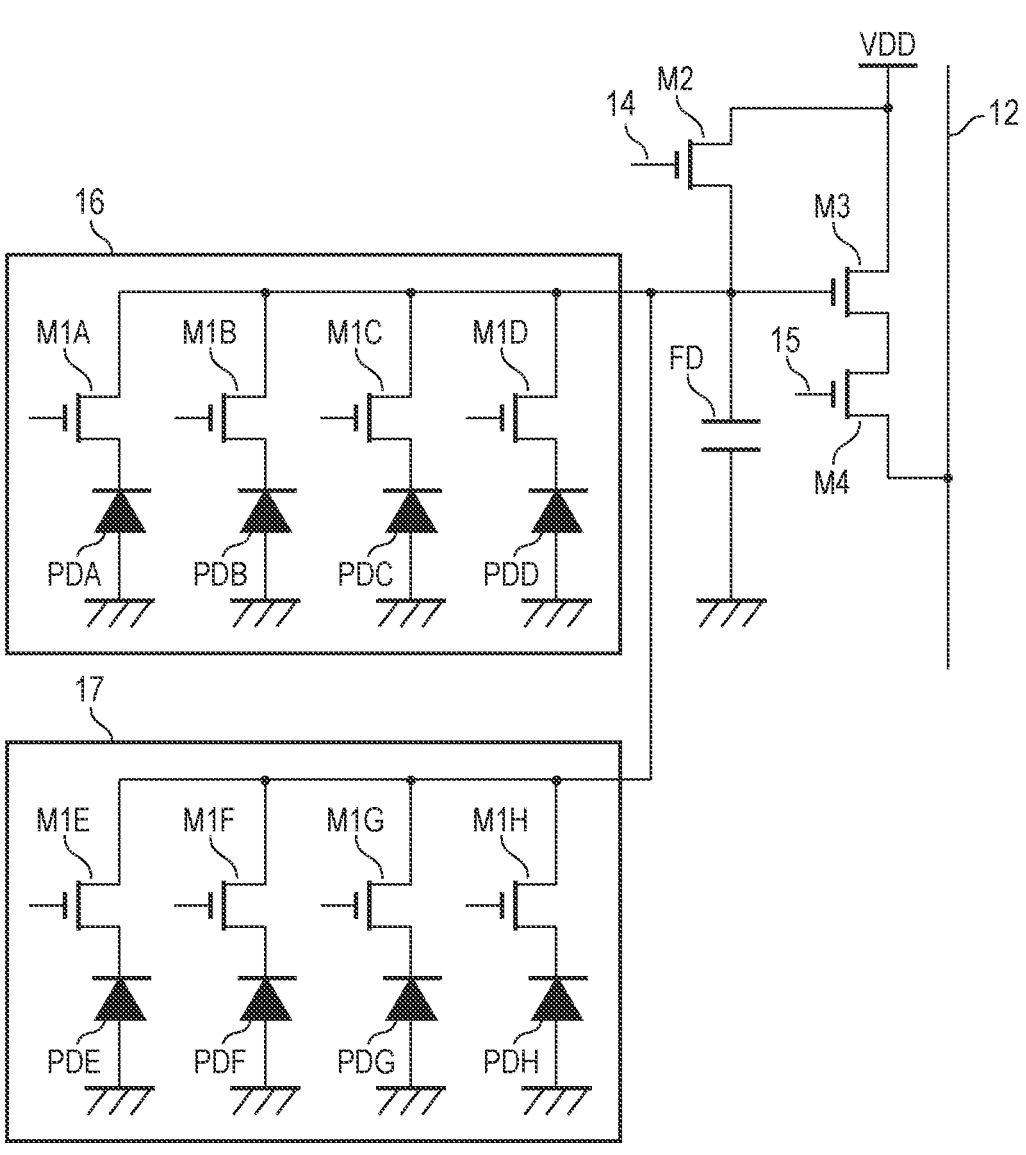
FIG. 12 is a circuit diagram of a pixel according to a sixth embodiment.

FIG. 12 is a circuit diagram of the pixel 11 according to the present embodiment. As illustrated in FIG. 12, the pixel 11 has two photoelectric conversion unit groups 16, 17. The photoelectric conversion unit group 16 has the photoelectric conversion units PDA, PDB, PDC, PDD and the transfer transistors M1A, M1B, M1C, M1D. Since these features are the same as those illustrated in FIG. 6, the description thereof will be omitted.

The photoelectric conversion unit group 17 has photoelectric conversion units PDE, PDF, PDG, PDH and transfer transistors M1E, M1F, M1G, M1H. The photoelectric conversion units PDE, PDF, PDG, PDH each are a photodiode, for example. The anodes of the photoelectric conversion units PDE, PDF, PDG, PDH are connected to the ground node. The cathodes of the photoelectric conversion units PDE, PDF, PDG, PDH are connected to the sources of the transfer transistors M1E, M1F, M1G, M1H, respectively. The drains of the transfer transistors M1E, M1F, M1G, M1H are connected to the node of the floating diffusion FD.

Since other features are substantially the same as those of FIG. 6, the description thereof will be omitted. In such a way, in the present embodiment, the two photoelectric conversion unit groups 16, 17 share a single floating diffusion FD.

Figures 13A, 13B:
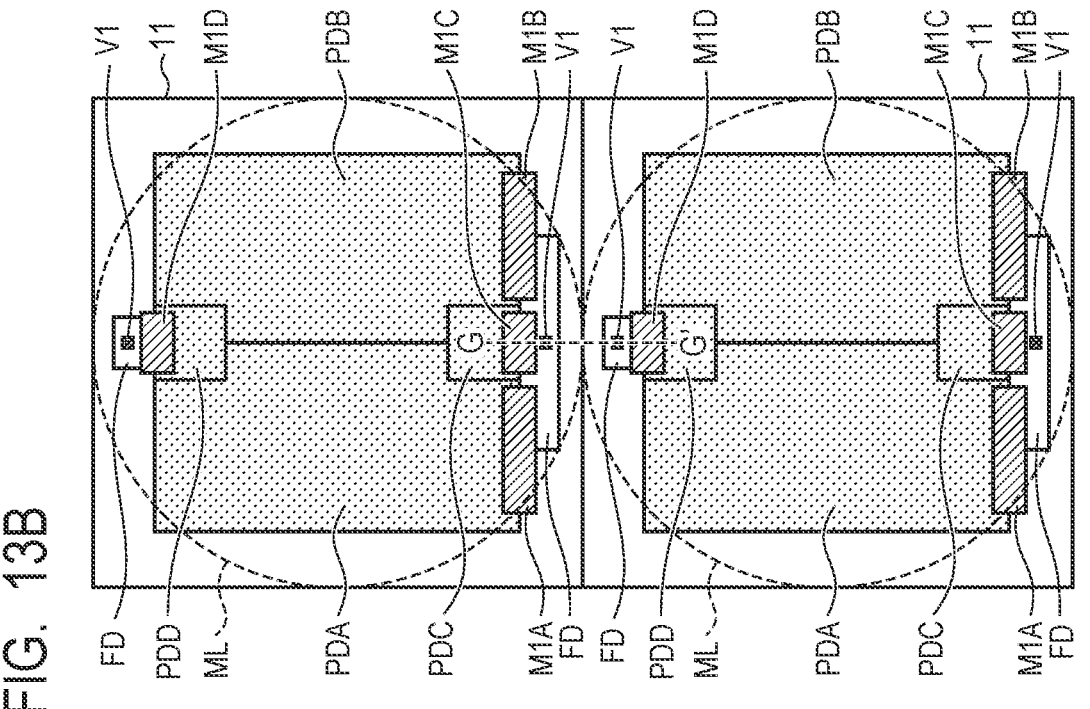
FIG. 13A and FIG. 13B are schematic plan views of the pixel according to the sixth embodiment.

FIG. 13A is a schematic plan view of the pixel 11 according to the present embodiment. As illustrated in FIG. 13A, the arrangement of the photoelectric conversion unit group 16 is substantially the same as that illustrated in FIG. 11A except for a part near the floating diffusion FD. The arrangement of the photoelectric conversion unit group 17 is a mirror reversal version of the photoelectric conversion unit group 16 with respect to the boundary line parallel to the direction D1 between the photoelectric conversion unit group 16 and the photoelectric conversion unit group 17. That is, the photoelectric conversion unit group 16 and the photoelectric conversion unit group 17 are substantially line-symmetrical with respect to the boundary line parallel to the direction D1 between the photoelectric conversion unit group 16 and the photoelectric conversion unit group 17. The semiconductor region of the floating diffusion FD arranged on the boundary line near the boundary between the photoelectric conversion unit group 16 and the photoelectric conversion unit group 17 is shared by the two of the photoelectric conversion unit group 16 and the photoelectric conversion unit group 17.

FIG. 13B is a comparative example to the present embodiment and illustrates a configuration in which two pixels 11 of the fifth embodiment are arranged adjacently with respect to the direction D1. The two pixels 11 are in a translational, positional relationship.

In the configuration of FIG. 13B, an element isolation region is arranged between the two floating diffusions FD on the line segment G-G' parallel to the direction D2. In contrast, in the configuration of FIG. 13A of the present embodiment, the single floating diffusion FD is arranged and no element isolation region is arranged on the line segment H-H' parallel to the direction D2. Therefore, in the configuration of FIG. 13A of the present embodiment, the length in the direction D2 of the photoelectric conversion units PDA, PDB, PDE, PDF can be increased, and the area of the photoelectric conversion units PDA, PDB, PDE, PDF can thus be increased compared to the configuration of FIG. 13B. Therefore, the sensitivity of the photoelectric conversion units PDA, PDB, PDE, PDF can be further improved.

According to the present embodiment, the photoelectric conversion device 1 that achieves more improved sensitivity in addition to having the advantageous effect described in the fifth embodiment is provided.

Seventh Embodiment

Figure 14:
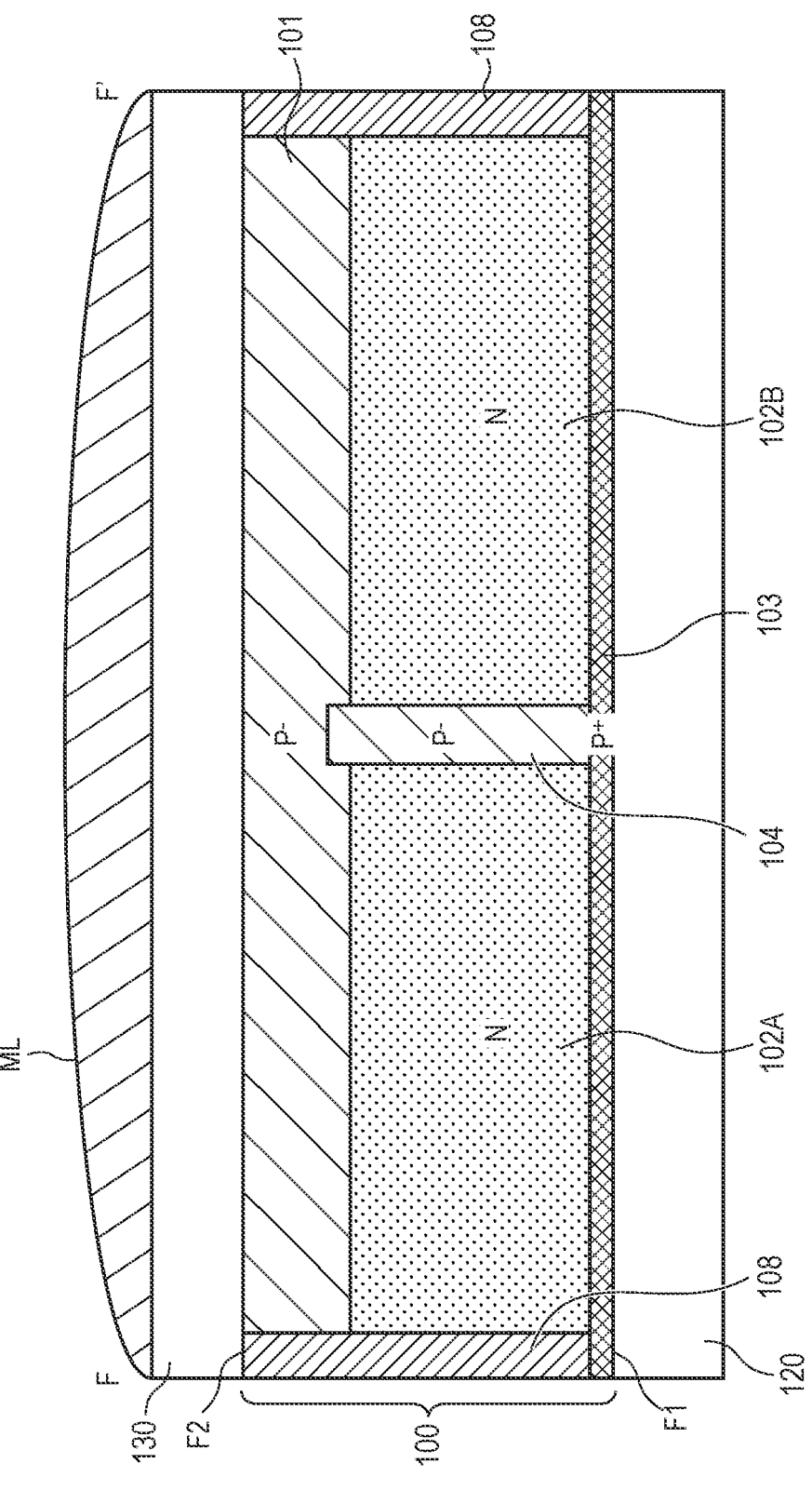
FIG. 14 is a schematic sectional view of a pixel according to a seventh embodiment.

The seventh embodiment will be described with reference to FIG. 14. The present embodiment is configured by modifying the configuration of the fifth embodiment to a back-illuminated type. Although features different from the fifth embodiment will be mainly described below, description of elements common to the fifth embodiment may be omitted or simplified.

In the present embodiment, the planar structure of the pixel 11 is the same as that in FIG. 11A of the fifth embodiment. FIG. 14 is a schematic sectional view of the pixel 11 according to the present embodiment. FIG. 14 schematically illustrates a cross section taken along the line F-F' in FIG. 11A. The P-type semiconductor regions 101, 103, 104, N-type semiconductor regions 102A, 102B, and an element isolation region 108 are arranged inside the semiconductor substrate 100. For example, the element isolation region 108 is formed by Deep Trench Isolation (DTI) isolation, P-type diffusion layer isolation, or the like.

The wiring layer 120 is arranged on the first face side of the semiconductor substrate 100. An insulating layer 130 that may include a planarization layer, a color filter, or the like is arranged on the second face side of the semiconductor substrate 100. The microlens ML is arranged on the insulating layer 130. That is, the photoelectric conversion device 1 of the present embodiment has the back-illuminated type structure that receives incident light at a face on the opposite side from the wiring layer 120. Since the incident light enters photoelectric conversion units without being reflected by the wiring in the wiring layer 120, the sensitivity of the photoelectric conversion unit may be improved.

According to the present embodiment, the photoelectric conversion device 1 that achieves more improved sensitivity in addition to having the advantageous effect described in the fifth embodiment is provided.

Eighth Embodiment

The photoelectric conversion devices in the embodiments described above are applicable to various equipment. The equipment may be a digital still camera, a digital camcorder, a camera head, a copier machine, a facsimile machine, a mobile phone, an on-vehicle camera, an observation satellite, a surveillance camera, or the like. FIG. 15 illustrates a block diagram of a digital still camera as an example of the equipment.

Equipment 70 illustrated in FIG. 15 includes a barrier 706, a lens 702, an aperture 704, and an imaging device 700 (an example of the photoelectric conversion device). Further, the equipment 70 further includes a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device compatible with the equipment. The barrier 706 protects the lens 702, and the lens 702 captures an optical image of a subject onto the imaging device 700. The aperture 704 can change the amount of light that has passed through the lens 702. The imaging device 700 is configured as with the embodiments described above and converts an optical image captured by the lens 702 into image data (image signal). The signal processing unit 708 performs various correction, data compression, or the like on imaging data output from the imaging device 700. The timing generation unit 720 outputs various timing signals to the imaging device 700 and the signal processing unit 708. The general control/operation unit 718 controls the overall digital still camera, and the memory unit 710 temporarily stores image data. The storage medium control I/F unit 716 is an interface used for storage or reading of image data on the storage medium 714, and the storage medium 714 is a removable storage medium such as a semiconductor memory used for storage or reading of imaging data. The external I/F unit 712 is an interface used for communicating with an external computer or the like. The timing signal or the like may be input from the outside of the equipment. Further, the equipment 70 may further have a display device (a monitor, an electronic view finder, or the like) configured to display information obtained by the photoelectric conversion device. The equipment has at least the photoelectric conversion device. Furthermore, the equipment 70 has at least any of the optical device, the control device, the processing device, the display device, the storage device, and a mechanical device configured to operate based on information obtained by the photoelectric conversion device. The mechanical device is a movable part (for example, a robot arm) configured to operate in response to receiving a signal from the photoelectric conversion device.

Each pixel may include a plurality of photoelectric conversion units (the first photoelectric conversion unit and the second photoelectric conversion unit). The signal processing unit 708 may be configured to process a pixel signal based on charges generated by the first photoelectric conversion unit and a pixel signal based on charges generated by the second photoelectric conversion unit to acquire distance information on the distance from the imaging device 700 to a subject.

Ninth Embodiment

Figures 16A, 16B:
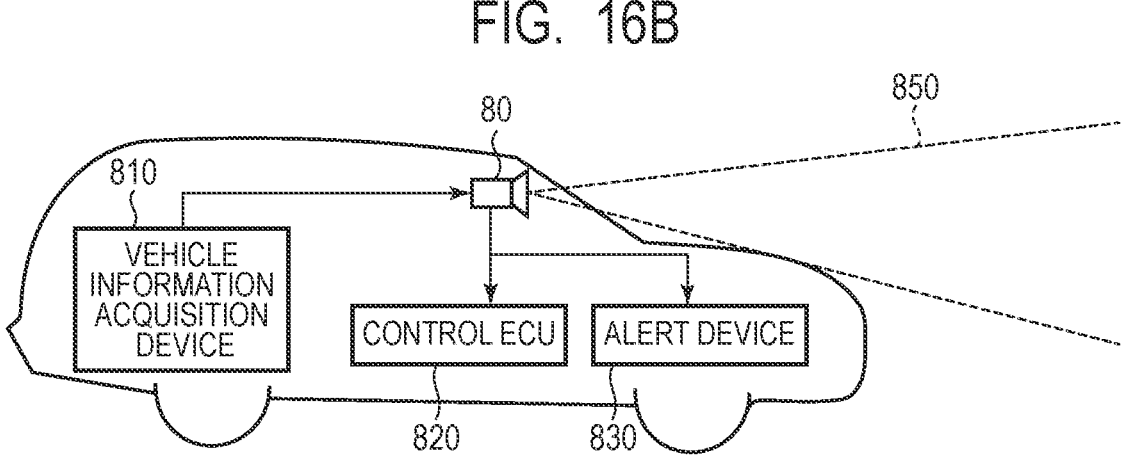
FIG. 16A and FIG. 16B are block diagrams of equipment according to a ninth embodiment.

FIG. 16A and FIG. 16B are block diagrams of the equipment related to an on-vehicle camera in the present embodiment. Equipment 80 has an imaging device 800 (an example of the photoelectric conversion device) of the embodiments described above and a signal processing device (processing device) that processes a signal from the imaging device 800. The equipment 80 has an image processing unit 801 that performs image processing on a plurality of image data acquired by the imaging device 800 and a parallax calculation unit 802 that calculates a parallax (a phase difference of parallax images) from the plurality of image data acquired by the equipment 80. Further, the equipment 80 has a distance measurement unit 803 that calculates a distance to an object based on the calculated parallax and a collision determination unit 804 that determines whether or not there is a collision possibility based on the calculated distance. Herein, the parallax calculation unit 802 and the distance measurement unit 803 represent an example of a distance information acquisition unit that acquires distance information on the distance to an object. That is, the distance information is information on a parallax, a defocus amount, a distance to an object, or the like. The collision determination unit 804 may use any of distance information to determine the collision possibility. The distance information acquisition unit may be implemented by dedicatedly designed hardware or may be implemented by a software module. Further, the distance information acquisition unit may be implemented by a field programmable gate array (FPGA) or an application specific integrated circuit (ASIC) or may be implemented by a combination thereof.

The equipment 80 is connected to the vehicle information acquisition device 810 and can acquire vehicle information such as a vehicle speed, a yaw rate, a steering angle, or the like. Further, the equipment 80 is connected to a control ECU 820, which is a control device that outputs a control signal for causing a vehicle to generate braking force based on a determination result by the collision determination unit 804. Further, the equipment 80 is also connected to an alert device 830 that issues an alert to the driver based on a determination result by the collision determination unit 804. For example, when the collision probability is high as the determination result of the collision determination unit 804, the control ECU 820 performs vehicle control to avoid a collision or reduce damage by applying a brake, retracting an accelerator, suppressing engine power, or the like. The alert device 830 alerts a user by sounding an alert such as a sound, displaying alert information on a screen of a car navigation system or the like, providing vibration to a seat belt or a steering wheel, or the like. The equipment 80 functions as a control unit that controls the operation of controlling a vehicle as described above.

In the present embodiment, an image of an area around a vehicle, for example, a front area or a rear area is captured by using the equipment 80. FIG. 16B illustrates equipment when capturing an image of a front area of a vehicle (a capturing area 850). The vehicle information acquisition device 810 as an imaging control unit instructs the equipment 80 or the imaging device 800 to perform an image capturing operation. Such a configuration can further improve the ranging accuracy.

Although the example of control to avoid a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an aircraft, a satellite, an industrial robot and a consumer use robot, or the like, for example. In addition, the equipment can be widely applied to equipment which utilizes object recognition or biometric recognition, such as an intelligent transportation system (ITS), a surveillance system, or the like without being limited to moving units.

MODIFIED EMBODIMENTS

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

The disclosed content of the present specification encompasses a complement set of the concept described in the present specification. That is, for example, when there is a statement of "A is B" (A=B) in the present specification, it is intended to imply that the present specification discloses or suggests "A is not B" even when the statement of "A is not B" (A≠B) is omitted. Because, when "A is B" is stated, it is assumed that a case where "A is not B" has been taken into consideration.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-030665, filed Mar. 1, 2022, which is hereby incorporated by reference herein in its entirety.

What is claimed is:

1. A photoelectric conversion device comprising:

a substrate;

a first photoelectric conversion unit, a second photoelectric conversion unit, and a third photoelectric conversion unit each arranged in the substrate and configured to generate charges based on incident light;

a microlens arranged over the substrate commonly to the first photoelectric conversion unit, the second photoelectric conversion unit, and the third photoelectric conversion unit;

a floating diffusion arranged in the substrate;

a first transfer transistor arranged in the substrate and configured to transfer charges generated by the first photoelectric conversion unit to the floating diffusion;

a second transfer transistor arranged in the substrate and configured to transfer charges generated by the second photoelectric conversion unit to the floating diffusion;

a third transfer transistor arranged in the substrate and configured to transfer charges generated by the third photoelectric conversion unit to the floating diffusion;

a first isolation part arranged in the substrate between the first photoelectric conversion unit and the second photoelectric conversion unit;

a second isolation part arranged in the substrate between the first photoelectric conversion unit and the third photoelectric conversion unit; and a third isolation part arranged in the substrate between the second photoelectric conversion unit and the third photoelectric conversion unit, wherein the first photoelectric conversion unit and the second photoelectric conversion unit are arranged so as to be aligned in a first direction in a plan view with respect to the substrate, wherein sensitivity of the third photoelectric conversion unit is lower than sensitivity of the first photoelectric conversion unit and lower than sensitivity of the second photoelectric conversion unit, wherein the third photoelectric conversion unit is arranged along a part of an outer circumference of a region including the first photoelectric conversion unit and the second photoelectric conversion unit in the plan view, wherein an impurity concentration in the second isolation part is higher than an impurity concentration in the first isolation part, and wherein an impurity concentration in the third isolation part is higher than an impurity concentration in the first isolation part.

2. The photoelectric conversion device according to claim 1, wherein the area of the third photoelectric conversion unit is smaller than the area of the first photoelectric conversion unit and smaller than the area of the second photoelectric conversion unit in the plan view.

3. The photoelectric conversion device according to claim 1, wherein each of the first photoelectric conversion unit, the second photoelectric conversion unit, and the third photoelectric conversion unit has a photodiode including a first semiconductor region of a first conductivity type in which the majority carrier is the same carrier as a signal carrier and a second semiconductor region of a second conductivity type that is different from the first conductivity type, and wherein a thickness of the first semiconductor region in the third photoelectric conversion unit is smaller than a thickness of the first semiconductor region in the first photoelectric conversion unit and smaller than a thickness of the first semiconductor region in the second photoelectric conversion unit.

4. The photoelectric conversion device according to claim 1, wherein a saturated charge amount of the third photoelectric conversion unit is smaller than a saturated charge amount of the first photoelectric conversion unit and smaller than a saturated charge amount of the second photoelectric conversion unit.

5. The photoelectric conversion device according to claim 1, wherein in a second direction orthogonal to the first direction, the centroid position of the third photoelectric conversion unit differs from the centroid position of the first photoelectric conversion unit and the centroid position of the second photoelectric conversion unit.

6. The photoelectric conversion device according to claim 1, wherein in the first direction, a distance between the centroid position of the third photoelectric conversion unit and the centroid position of the second photoelectric conversion unit is larger than a distance between the centroid position of the third photoelectric conversion unit and the centroid position of the first photoelectric conversion unit.

7. The photoelectric conversion device according to claim 1 further comprising:

a fourth photoelectric conversion unit arranged in the substrate and configured to generate charges based on incident light; and a fourth transfer transistor arranged in the substrate and configured to transfer charges generated by the fourth photoelectric conversion unit to the floating diffusion, wherein the microlens is arranged commonly to the first photoelectric conversion unit, the second photoelectric conversion unit, the third photoelectric conversion unit, and the fourth photoelectric conversion unit.

8. The photoelectric conversion device according to claim 7, wherein the third photoelectric conversion unit and the fourth photoelectric conversion unit are arranged so as to be aligned in the first direction in the plan view.

9. The photoelectric conversion device according to claim 7, wherein the third photoelectric conversion unit and the fourth photoelectric conversion unit are arranged so as to be aligned in a second direction orthogonal to the first direction in the plan view.

10. The photoelectric conversion device according to claim 7, wherein the fourth photoelectric conversion unit is arranged along a part of an outer circumference of a region including the first photoelectric conversion unit and the second photoelectric conversion unit in the plan view.

11. The photoelectric conversion device according to claim 7 comprising:

two third photoelectric conversion units;

two third transfer transistors configured to transfer charges generated by the two third photoelectric conversion units to the floating diffusion, respectively;

two fourth photoelectric conversion units; and two fourth transfer transistors configured to transfer charges generated by the two fourth photoelectric conversion units to the floating diffusion, respectively.

12. The photoelectric conversion device according to claim 11, wherein one of the two third photoelectric conversion units and one of the two fourth photoelectric conversion units are arranged so as to be aligned in a third direction intersecting the first direction.

13. The photoelectric conversion device according to claim 1 comprising:

two first transfer transistors connected in parallel; and two second transfer transistors connected in parallel.

14. The photoelectric conversion device according to claim 1 comprising a plurality of pixels each including the first photoelectric conversion unit, the second photoelectric conversion unit, the third photoelectric conversion unit, the first transfer transistor, the second transfer transistor, and the third transfer transistor, wherein the first transfer transistor, the second transfer transistor, and the third transfer transistor included in each of adjacent two pixels of the plurality of pixels transfer charges to common floating diffusion, and wherein the common floating diffusion is arranged between the two pixels in the plan view.

15. The photoelectric conversion device according to claim 1, wherein the substrate has a first face and a second face, wherein a wiring to supply a control signal input to the first transfer transistor, the second transfer transistor, and the third transfer transistor is arranged on the first face side, and wherein the microlens is arranged on the second face side.

16. Equipment comprising:

the photoelectric conversion device according to claim 1; and at least any one of:

an optical device adapted for the photoelectric conversion device, a control device configured to control the photoelectric conversion device, a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

17. The equipment according to claim 16, wherein the processing device processes image signals generated by a plurality of photoelectric conversion units, respectively, and acquires distance information on a distance from the photoelectric conversion device to an object.

18. The photoelectric conversion device according to claim 1, wherein in the plan view, at least a part of the third photoelectric conversion unit and at least a part of the floating diffusion are arranged in this order along a direction from a center of the microlens toward an outer periphery of the microlens.

19. A photoelectric conversion device comprising:

a substrate;

a first photoelectric conversion unit, a second photoelectric conversion unit, and a third photoelectric conversion unit each arranged in the substrate and configured to generate charges based on incident light;

a microlens arranged over the substrate commonly to the first photoelectric conversion unit, the second photoelectric conversion unit, and the third photoelectric conversion unit;

a first isolation part arranged in the substrate between the first photoelectric conversion unit and the second photoelectric conversion unit;

a second isolation part arranged in the substrate between the first photoelectric conversion unit and the third photoelectric conversion unit; and a third isolation part arranged in the substrate between the second photoelectric conversion unit and the third photoelectric conversion unit, wherein a saturated charge amount of the third photoelectric conversion unit is smaller than a saturated charge amount of the first photoelectric conversion unit and smaller than a saturated charge amount of the second photoelectric conversion unit, wherein the first photoelectric conversion unit and the second photoelectric conversion unit are arranged so as to be aligned in a first direction in a plan view with respect to the substrate, wherein in the first direction, a distance between the centroid position of the third photoelectric conversion unit and the centroid position of the second photoelectric conversion unit is larger than a distance between the centroid position of the third photoelectric conversion unit and the centroid position of the first photoelectric conversion unit, wherein an impurity concentration in the second isolation part is higher than an impurity concentration in the first isolation part, and wherein an impurity concentration in the third isolation part is higher than an impurity concentration in the first isolation part.

20. The photoelectric conversion device according to claim 19, wherein the area of the third photoelectric conversion unit is smaller than the area of the first photoelectric conversion unit and smaller than the area of the second photoelectric conversion unit in the plan view.

21. The photoelectric conversion device according to claim 19, wherein each of the first photoelectric conversion unit, the second photoelectric conversion unit, and the third photoelectric conversion unit has a photodiode including a first semiconductor region of a first conductivity type in which the majority carrier is the same carrier as a signal carrier and a second semiconductor region of a second conductivity type that is different from the first conductivity type, and wherein a thickness of the first semiconductor region in the third photoelectric conversion unit is smaller than a thickness of the first semiconductor region in the first photoelectric conversion unit and smaller than a thickness of the first semiconductor region in the second photoelectric conversion unit.

22. Equipment comprising:

the photoelectric conversion device according to claim 19; and at least any one of:

an optical device adapted for the photoelectric conversion device, a control device configured to control the photoelectric conversion device, a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

23. The equipment according to claim 22, wherein the processing device processes image signals generated by a plurality of photoelectric conversion units, respectively, and acquires distance information on a distance from the photoelectric conversion device to an object.

24. The photoelectric conversion device according to claim 19 further comprising a floating diffusion arranged in the substrate, wherein charges are transferred from the first photoelectric conversion unit, the second photoelectric conversion unit, and the third photoelectric conversion unit to the floating diffusion, and wherein in the plan view, at least a part of the third photoelectric conversion unit and at least a part of the floating diffusion are arranged in this order along a direction from a center of the microlens toward an outer periphery of the microlens.

* * * * *